US008563229B2

(12) United States Patent
Tran

(10) Patent No.: US 8,563,229 B2
(45) Date of Patent: *Oct. 22, 2013

(54) PROCESS OF SEMICONDUCTOR FABRICATION WITH MASK OVERLAY ON PITCH MULTIPLIED FEATURES AND ASSOCIATED STRUCTURES

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 644 days.

This patent is subject to a terminal disclaimer.

(21) Appl. No.: 11/831,012

(22) Filed: Jul. 31, 2007

(65) Prior Publication Data
US 2009/0035665 A1 Feb. 5, 2009

(51) Int. Cl.
G03F 7/20 (2006.01)

(52) U.S. Cl.
USPC .......................... 430/323; 430/324; 430/327

(58) Field of Classification Search
USPC .......................................... 430/323, 324, 327
See application file for complete search history.

(56) References Cited

U.S. PATENT DOCUMENTS

| 4,234,362 A | 11/1980 | Riseman |
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,648,937 A | 3/1987 | Ogura et al. |
| 4,716,131 A | 12/1987 | Okazawa et al. |
| 4,776,922 A | 10/1988 | Bhattacharyya et al. |
| 4,838,991 A | 6/1989 | Cote et al. |
| 5,013,680 A | 5/1991 | Lowrey et al. |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |

(Continued)

FOREIGN PATENT DOCUMENTS

| DE | 42 36 609 A1 | 5/1994 |
| EP | 0227303 | 7/1987 |

(Continued)

OTHER PUBLICATIONS

Bruek, S.R.J., "Optical and interferometric lithography—Nanotechnology enablers," *Proceedings of the IEEE*, vol. 93, No. 10, Oct. 2005, pp. 1704-1721.

Sheats et al., "Microlithography: Science and Technology," *Marcel Dekkar, Inc.*, pp. 104-105 (1998).

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

Bergeron, et al., "Resolution Enhancement Techniques for the 90nm Technology Node and Beyond," Future Fab International, Issue 15, Jul. 11, 2003, 4 pages.

(Continued)

*Primary Examiner* — Daborah Chacko Davis
(74) *Attorney, Agent, or Firm* — Knobbe, Martens, Olson & Bear LLP

(57) ABSTRACT

Spacers are formed by pitch multiplication and a layer of negative photoresist is deposited on and over the spacers to form additional mask features. The deposited negative photoresist layer is patterned, thereby removing photoresist from between the spacers in some areas. During patterning, it is not necessary to direct light to the areas where negative photoresist removal is desired, and the clean removal of the negative photoresist from between the spacers is facilitated. The pattern defined by the spacers and the patterned negative photoresist is transferred to one or more underlying masking layers before being transferred to a substrate.

16 Claims, 26 Drawing Sheets

(56) References Cited

U.S. PATENT DOCUMENTS

| | | |
|---|---|---|
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,442,976 B2 | 10/2008 | Juengling |
| 7,537,866 B2 | 5/2009 | King Liu |
| 7,651,951 B2 * | 1/2010 | Tran et al. .................. 438/738 |
| 7,687,408 B2 * | 3/2010 | Abatchev et al. ............ 438/751 |
| 7,851,135 B2 | 12/2010 | Jung |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura et al. |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou et al. |
| 2005/0153562 A1 | 7/2005 | Furukawa et al. |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0234138 A1 | 10/2006 | Fehlhaber et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0275309 A1 | 11/2007 | Liu |
| 2008/0054350 A1 | 3/2008 | Breitwisch et al. |
| 2008/0292991 A1 | 11/2008 | Wallow |

FOREIGN PATENT DOCUMENTS

| | | |
|---|---|---|
| EP | 0491408 | 6/1992 |
| EP | 1357433 | 10/2003 |
| JP | 57-048237 | 3/1982 |
| JP | 64-035916 | 2/1989 |
| JP | 05343370 | 12/1993 |
| JP | H8-55908 | 2/1996 |
| JP | H8-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-351861 | 1/2012 |
| KR | 1999-0001440 | 1/1999 |
| KR | 1999-027887 | 4/1999 |
| WO | WO 94/15261 | 7/1994 |
| WO | WO 02/099864 A1 | 12/2002 |
| WO | WO 2004/001799 A2 | 12/2003 |
| WO | WO 2004/003977 A2 | 1/2004 |
| WO | WO 2005/034215 A1 | 4/2005 |
| WO | WO 2006/026699 | 3/2006 |
| WO | WO 2006/127586 A2 | 11/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines*," J.Vac.Sci.Technol. B21(4), Jule/Aug. 2003, pp. 1491-95.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

U.S. Appl. No. 11/543,515, filed Oct. 24, 2006.

Ex Parte Cantell, unpublished decision of the Board of Patent Appeals and Interferences, Mar. 4, 2005.

(56) References Cited

OTHER PUBLICATIONS

Park et al., "Mass-productive ultra-low temperature ALD SiO$_2$ process promising for sub-90nm memory and logic devices", Electron Devices Meeting, IEDM '02 Digest. International pp. 229-232 (2002).

Search Report and Written Opinion dated Mar. 15, 2010 in corresponding Singapore Patent Application No. 200807334-8.

Choi et al., "Sublithographic nanofabrication technology for nanocatalysts and DNA chips," *J.Vac. Sci. Technol.*, pp. 2951-2955 (Nov./Dec. 2003).

* cited by examiner

PROCESS OF SEMICONDUCTOR FABRICATION WITH MASK OVERLAY ON PITCH MULTIPLIED FEATURES AND ASSOCIATED STRUCTURES

REFERENCE TO RELATED APPLICATIONS

This application is related to and incorporates the following by reference in their entireties: U.S. patent application Ser. No. 10/931,772 to Abatchev et al., filed Aug. 31, 2004; U.S. patent application Ser. No. 10/932,993 to Abatchev et al., filed Sep. 1, 2004; U.S. patent application Ser. No. 10/931,771 to Tran et al., filed Aug. 31, 2004; U.S. patent application Ser. No. 10/934,317 to Sandhu et al., filed Sep. 2, 2004; U.S. patent application Ser. No. 10/934,778 to Abatchev et al., filed Sep. 2, 2004; U.S. patent application Ser. No. 11/216,477 to Tran et al., filed Aug. 31, 2005; U.S. patent application Ser. No. 11/214,544 to Tran et al., filed Aug. 29, 2005; U.S. patent application Ser. No. 11/134,982 to Abatchev et al., filed May 23, 2005; U.S. patent application Ser. No. 11/217,270 to Wells, filed Sep. 1, 2005; U.S. patent application Ser. No. 11/219,067 to Tran, filed Sep. 1, 2005; U.S. patent application Ser. No. 11/219,604 to Abatchev et al., filed Sep. 1, 2005; U.S. patent application Ser. No. 11/400,603 to Niroomand et al., filed Apr. 7, 2006; U.S. patent application Ser. No. 11/411,401 to Kewley, filed Apr. 25, 2006; and U.S. patent application Ser. No. 11/521,851 to Fischer et al., filed Sep. 14, 2006.

BACKGROUND OF THE INVENTION

1. Field of the Invention

This invention relates generally to the fabrication of integrated circuits and electronic devices and, more particularly, to masking techniques and related structures.

2. Description of the Related Art

As a consequence of many factors, including demand for increased portability, computing power, memory capacity and energy efficiency, integrated circuits are constantly being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically includes millions or billions of identical circuit elements, known as memory cells. A memory cell typically consists of two electrical devices: a storage capacitor and an access field effect transistor. Each memory cell is an addressable location that may store one bit (binary digit) of data. A bit may be written to a cell through the transistor and may be read by sensing charge in the capacitor.

In another example, flash memory typically includes billions of flash memory cells containing floating gate field effect transistors that can retain a charge. The presence or absence of a charge in the floating gate determines the logic state of the memory cell. A bit may be written to a cell by injecting charge to or removing charge from a cell. Flash memory cells may be connected in different architecture configurations, each with different schemes for reading bits. In a "NOR" architecture configuration, each memory cell is coupled to a bit line and may be read individually. In a "NAND" architecture configuration, memory cells are aligned in a "string" of cells, and an entire bit line is activated to access data in one of the string of cells.

In general, by decreasing the sizes of the electrical devices that constitute a memory cell and the sizes of the conducting lines that access the memory cells, the memory devices may be made smaller. Additionally, storage capacities may be increased by fitting more memory cells on a given area in the memory devices.

The concept of pitch may be used to describe one aspect of the sizes of features in an integrated circuit such as a memory device. Pitch is defined as the distance between an identical point in two neighboring features, such as features in an array, which are typically arranged in a repeating pattern. These features are typically defined by spaces between adjacent features, which spaces are typically filled by a material, such as an insulator. As a result, pitch may be viewed as the sum of the width of a feature and of the width of the space on one side of the feature separating that feature from a neighboring feature. It will be appreciated that the spaces and features, such as lines, typically repeat to form a repetitive pattern of spacers and features.

Critical dimension (CD) is another term used to describe the sizes of features. The critical dimension is the smallest dimension of a feature in a particular circuit or masking scheme. Controlling the CD of certain structures, such as shallow trench isolation (STI) structures, during integrated circuit fabrication helps to facilitate the continued size reduction of integrated circuits by, e.g., ensuring predictable circuit performance.

The continual reduction in feature sizes places ever greater demands on the techniques used to form the features. For example, photolithography is commonly used to pattern features, such as conductive lines, in integrated circuit fabrication. However, due to factors such as optics, light or radiation wavelength and available photoresist materials, photolithography techniques may each have a minimum pitch or critical dimension below which a particular photolithographic technique cannot reliably form features. Thus, the inherent limitations of photolithographic techniques are obstacles to continued feature size reduction.

"Pitch doubling" or "pitch multiplication" is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern in the photoresist layer is transferred to the layer 20, thereby forming placeholders, or mandrels, 40. The photoresist lines 10 are stripped and the mandrels 40 are etched to increase the distance between neighboring mandrels 40, as shown in FIG. 1C. A layer 50 of spacer material is subsequently deposited over the mandrels 40, as shown in FIG. 1D. Spacers 60 are then formed on the sides of the mandrels 40. The spacer formation is accomplished by preferentially etching the spacer material from the horizontal surfaces 70 and 80, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by the spacers 60.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

While allowing for smaller critical dimensions and pitch, pitch multiplication faces continuing development as new challenges emerge, as the sizes of features in integrated circuits continue to decrease. Accordingly, there is a constant need for methods and structures for forming small features.

DETAILED DESCRIPTION OF THE SOME EMBODIMENTS

It will be appreciated that integrated circuits generally employ features of different sizes. For example, memory circuits typically contain arrays of memory cells located in one part of the circuits and logic circuits located in the so-called "periphery," outside of the arrays. In the arrays, the memory cells are typically connected by conductive lines and, in the periphery, the conductive lines typically contact landing pads for connecting arrays to logic. Peripheral features such as landing pads, however, may be larger than the conductive lines. In addition, periphery electrical devices, including peripheral transistors, may be larger than the electrical devices in the array.

Figure 1A:
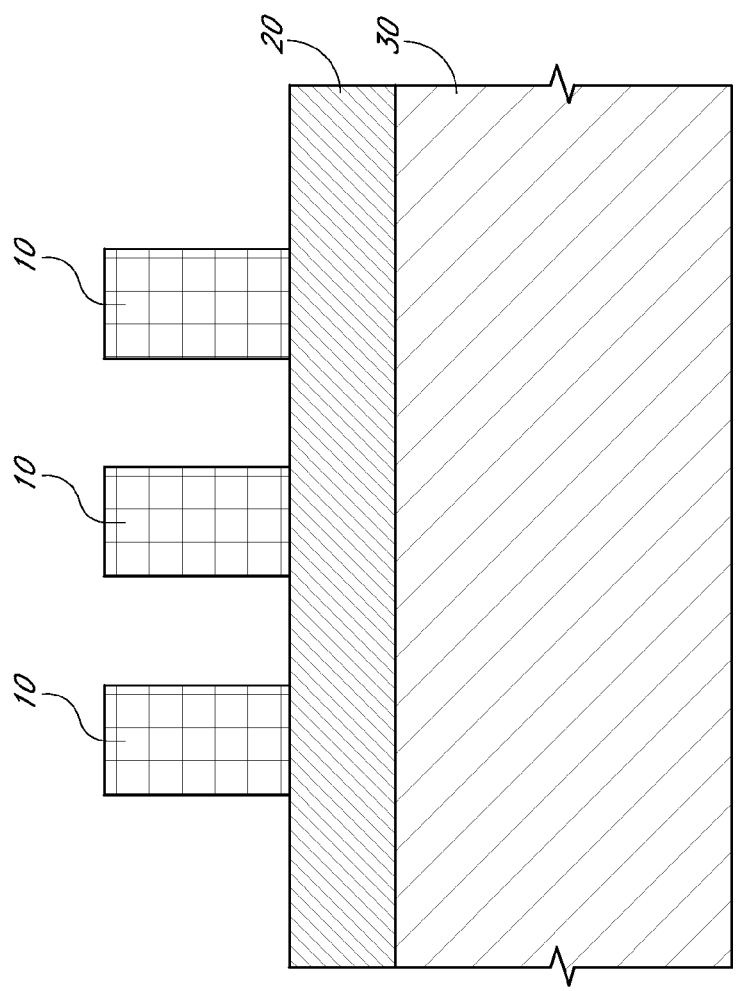
FIGS. 1A-1F are schematic, cross-sectional side views of a sequence of masking patterns for forming conductive lines, in accordance with a prior art pitch doubling method.
Figure 1B:
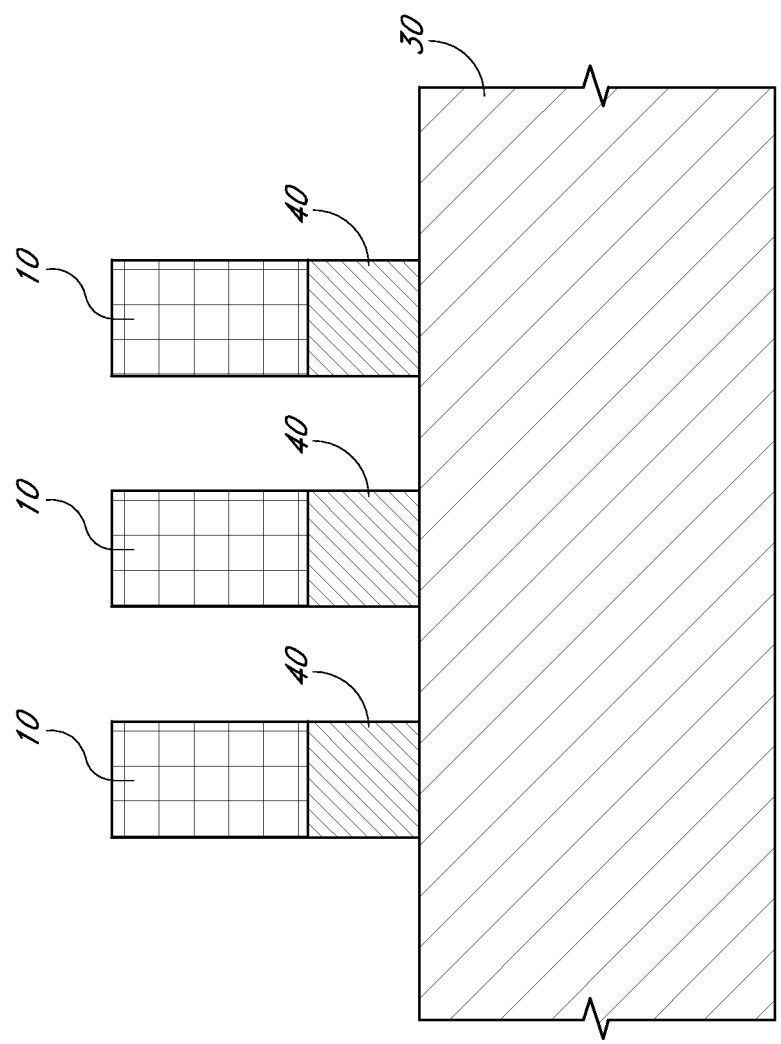
Figure 1C:
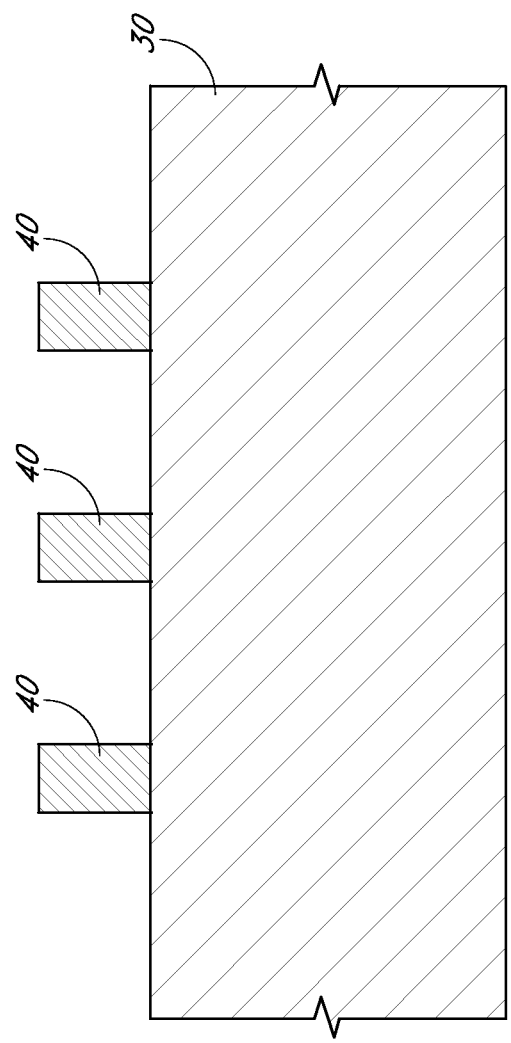
Figure 1D:
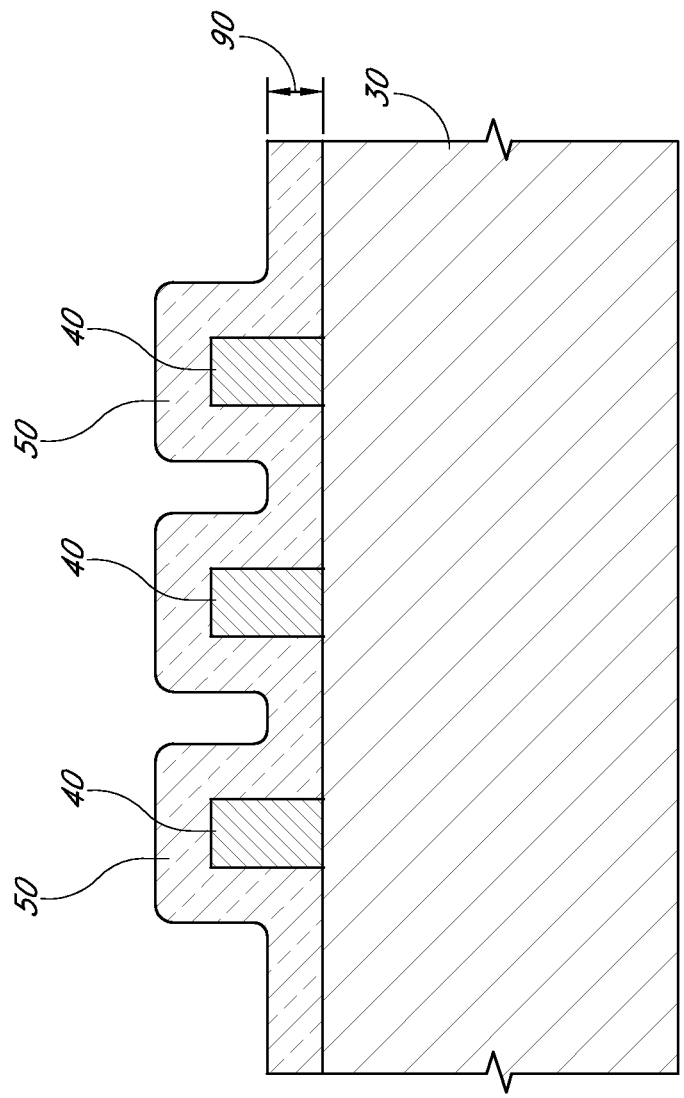
Figure 1E:
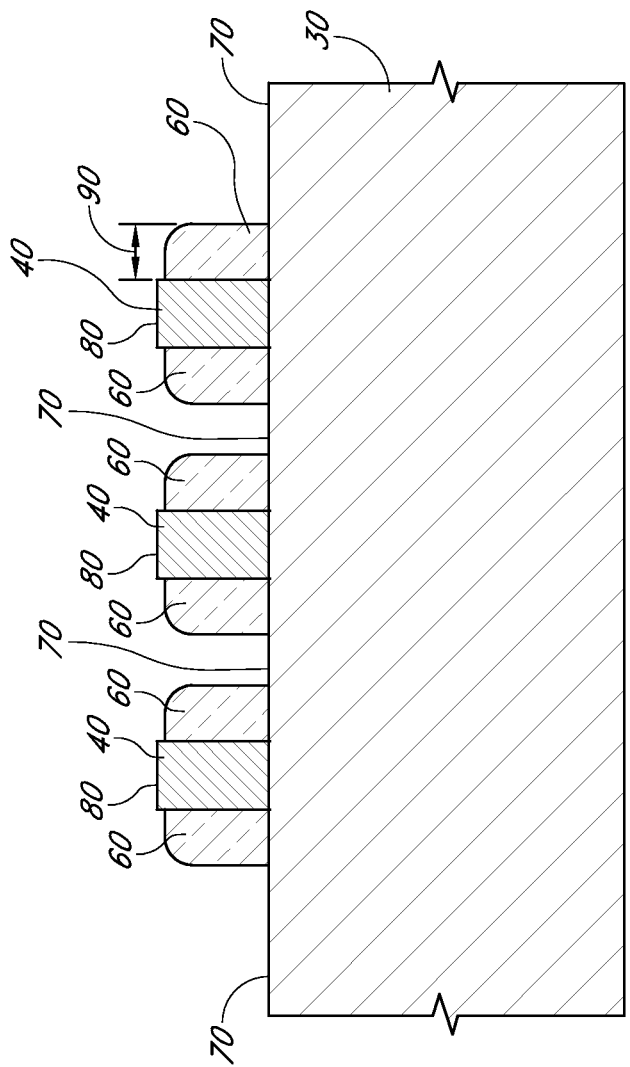
Figure 1F:
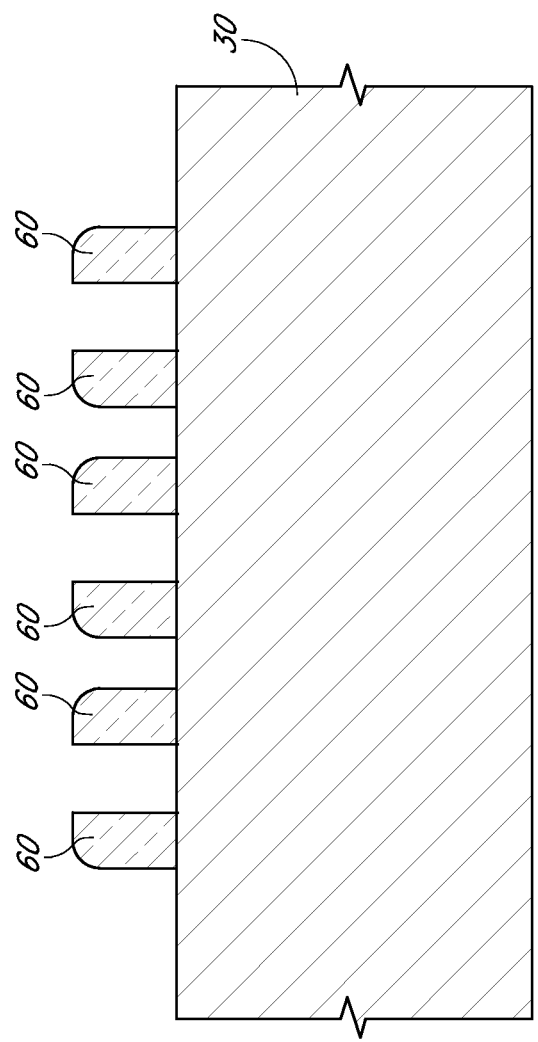

Pitch multiplication, however, is conventionally limited in its ability to form features of different sizes or shapes. For example, with reference to FIGS. 1D and 1E, because the layer 50 of spacer material typically has a single thickness and because the sizes of the features formed by the spacers 60 usually correspond to that thickness 90, pitch doubling typically produces features of only one width. Moreover, even if peripheral features may be formed with the same pitch or widths as features in the array, because mask patterns formed by pitch multiplication may be limited to those that are formed along the sidewalls of mandrels, pitch multiplication typically does not offer the flexibility, e.g., geometric flexibility, required to define some desired features.

To overcome such limitations, a non-pitch multiplied mask may be overlaid a pitch multiplied mask to form a combined mask. The combined mask has the benefit of tightly-spaced, pitch-multiplied features on one part of a mask and larger and/or more geometrically varied features on another part of the mask. To form the combined mask, pitch-multiplied mask features, such as spacers, are formed by pitch multiplication and a photoresist layer is deposited directly on and extending above the pitch-multiplied features. The photoresist layer may be patterned by photolithography to form the non-pitch multiplied mask pattern. Patterning the photoresist involves removing some of the photoresist extending on and over the spacers to expose the spacers, so that the part of the combined pattern defined by the spacers may later be transferred to a substrate.

It has been found, however, that positive photoresist may have difficulties forming combined mask patterns that are "clean." To remove desired portions of the positive photoresist, those portions of the photoresist are exposed to light and then developed. Typically, the light exposure initiates a chemical reaction which facilitates photoresist removal during the development phase. Thus, to remove photoresist between spacers, or other pitch multiplied features, light is directed into the volume between those spacers. As the pitch of the spacers decrease, however, it becomes increasingly difficult for light to fully penetrate into that volume. For example, shadows cast by the spacers and the absorption of light by the photoresist itself may impede the penetration of the light. As a result, some residual positive photoresist may remain between spacers after development, leaving a mask which is not "clean".

Increasing the intensity of the light has been found to be ineffective for removing the residual photoresist. For example, increasing the light intensity may cause undesired cross-linking of the photoresist, thereby forming a polymer that is difficult to remove. Moreover, this cross-linking may be more pronounced in the volume between spacers and can be especially pronounced when spacer CD's, and/or the width of the volume between spacers, are reduced below about 30 nm. For example, without being limited by theory, some spacers, such as silicon oxide spacers, may transmit and focus light. These spacers may locally increase the light intensity in some parts of the volume between the spacers. Thus, increasing the light intensity may increase, rather than decrease, the amount of residual photoresist present after exposure in an area which is desired to be open, and spacers may further increase the occurrence of cross-linking.

Embodiments of the invention allow for the formation of small features using a mask that is exceptionally clean, with lower levels of residual photoresist than a similar mask formed using positive resist. Embodiments of the invention utilize negative photoresist in combination with small or closely spaced features, including pitch-multiplied features such as spacers, to form the mask pattern. The pitch-multiplied features are formed over a desired area of a substrate, thereby forming a pitch-multiplied pattern. Negative photoresist is deposited over and between the spacers. The negative photoresist is patterned and, in some areas, may be removed from between the pitch-multiplied spacers, allowing a second pattern to be overlaid the pitch-multiplied pattern. The second pattern may be connected to or separated from the pitch-multiplied pattern. It will be appreciated that multiple pitch-multiplied patterns may be formed and the second pattern may be overlaid one or more of those pitch-multiplied patterns. Thus, in some embodiments, some small features may be formed having a pitch below the minimum pitch of a photolithographic method which is used to form other relatively large features.

The negative photoresist may be removed without exposure to light. As a result, the negative photoresist does not exhibit the problems associated with insufficient light penetration in the areas where photoresist removal is desired. Moreover, undesired cross-linking due to overexposure to light is prevented, since those areas are not exposed to light. Advantageously, embodiments of the invention allow the formation of clean masks using photoresist in combination with features having a pitch of about 100 nm or less or about 50 nm or less. In some embodiments, the CD's of the features can be about half the pitch or less, e.g., about 50 nm or less, or about 25 nm or less. It will be appreciated that using positive photoresist with such closely spaced features may result in relatively high levels of residue photoresist between the features. In addition, spacer materials, such as silicon oxide, which transmit and/or deflect the radiation used to pattern the photoresist, may be utilized without undesired focusing of the radiation causing crosslinking of the photoresist.

Reference will now be made to the Figures, wherein like numerals refer to like parts throughout. It will be appreciated that these Figures are not necessarily drawn to scale.

In a first phase of embodiments of the invention, mask features are formed by pitch multiplication.

Figure 2A:
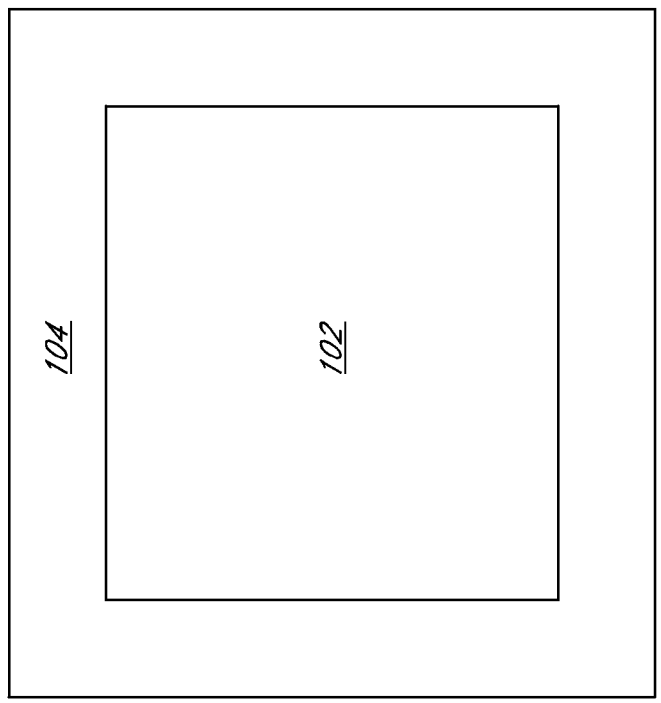
FIG. 2A is a schematic top plan view of a partially formed integrated circuit, in accordance with embodiments of the invention.

FIG. 2A shows a top view of a portion of an integrated circuit 100. While the embodiments of the invention may be used to form any integrated circuit and may be applied to form masks for patterning various substrates, they may particularly advantageously be applied to form devices having arrays of electrical devices, including memory cell arrays for volatile and non-volatile memory devices such as DRAM, ROM or flash memory, including NAND or NOR flash memory, or integrated circuits having logic or gate arrays. For example, the logic array may be a field programmable gate array (FPGA) having a core array similar to a memory array and a periphery with supporting logics. Consequently, the integrated circuit 100 may be, e.g., a memory chip or a processor, which may include both a logic array and embedded memory, or any other integrated circuit having a logic or a gate array.

With continued reference to FIG. 2A, a central region 102, the "array," is surrounded by a peripheral region 104, the "periphery." It will be appreciated that, in a fully formed integrated circuit 100, the array 102 will typically be densely populated with conducting lines and electrical devices, including transistors and/or capacitors. In a memory device, the electrical devices form a plurality of memory cells, which may be arranged in a regular grid pattern at the intersection of word lines and bit lines. Desirably, pitch multiplication may be used to form features such as rows/columns of transistors and/or capacitors in the array 102, as discussed below. On the other hand, the periphery 104 typically comprises features larger than those in the array 102. Conventional photolithography, rather than pitch multiplication, is preferably used to pattern features, such as logic circuitry, in the periphery 104, because the geometric complexity of logic circuits located in the periphery 104 makes using pitch multiplication difficult, whereas the regular grid typical of array patterns is conducive to pitch multiplication. In addition, some devices in the periphery require larger geometries due to electrical constraints, thereby making pitch multiplication less advantageous than conventional photolithography for such devices. In some cases, the periphery 104 can contain patterns/circuits defined by both conventional lithography and pitch multiplication. In addition to possible differences in relative scale, it will be appreciated by the skilled artisan that the relative positions, and the number of periphery 104 and array 102 regions in the integrated circuit 100 may vary from that depicted.

Figure 2B:
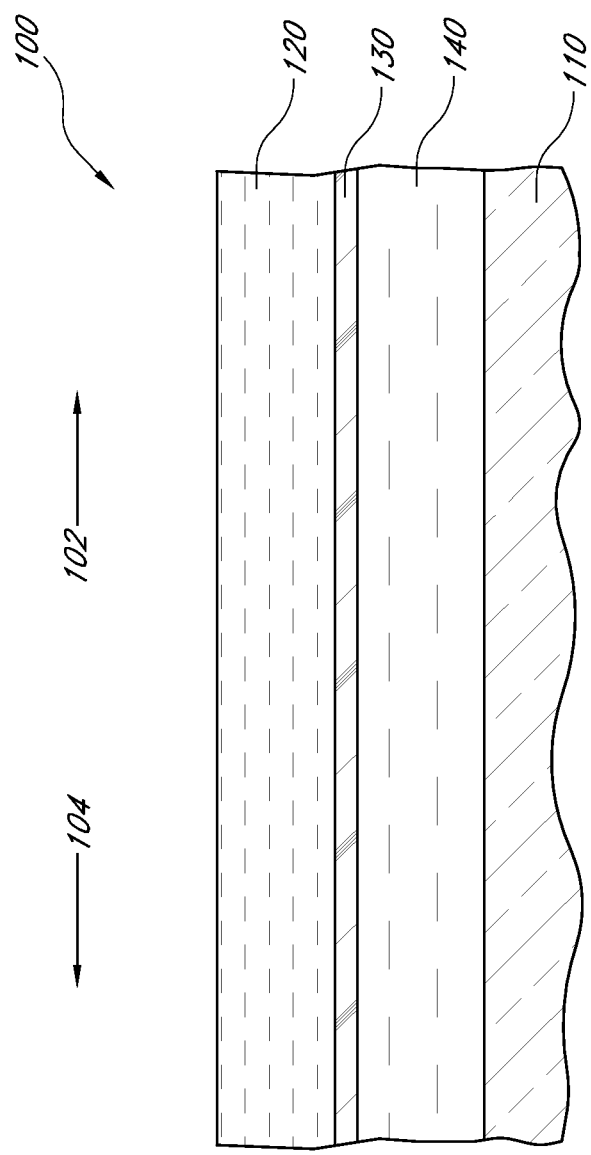
FIGS. 2B-2C are schematic cross-sectional side views of the partially formed integrated circuit of FIG. 2A, in accordance with embodiments of the invention.

FIG. 2B shows a cross-sectional side view of the partially formed integrated circuit 100. Various masking layers 120-140 are provided above a substrate 110. The layers 120-140 will be etched to form a mask for patterning the substrate 110, as discussed below. In the illustrated embodiment, a selectively definable layer 120 overlies a hard mask, or etch stop, layer 130, which overlies a primary mask layer 140, which overlies the substrate 110 to be processed (e.g., etched) through a mask.

The materials for the layers 120-140 overlying the substrate 110 are chosen based upon consideration of the chemistry and process conditions for the various pattern forming and pattern transferring steps discussed herein. Because the layers between the topmost selectively definable layer 120 and the substrate 110 function to transfer a pattern derived from the selectively definable layer 120 to the substrate 110, the layers 130-140 between the selectively definable layer 120 and the substrate 110 are chosen so that they may be selectively etched relative to other exposed materials. It will be appreciated that a material is considered selectively, or preferentially, etched when the etch rate for that material is at least about 2-3 times greater, at least about 10 times greater, at least about 20 times greater, or at least about 40 times greater than that for surrounding materials. Because a goal of the layers 120-130 overlying the primary hard mask layer 140 is to allow well-defined patterns to be formed in that layer 140, it will be appreciated that one or more of the layers 120-130 may be omitted or substituted if suitable other materials, chemistries and/or process conditions are used. For example, where the substrate is relatively simple and may be selectively etched relative to the hard mask layer 130, the primary hard mask layer 140 may be omitted and patterns may be transferred directly to the substrate using the hard mask layer 130.

With continued reference to FIG. 2B, the selectively definable layer 120 is photodefinable, e.g., formed of a photoresist, including any photoresist, including any positive or negative photoresist, known in the art. For example, the photoresist may be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, may be used to define the selectively definable layer 120. Examples of photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are used with photolithography systems utilizing relatively short wavelength light, e.g., 193 nm wavelength light. KrF photoresists are used with longer wavelength photolithography systems, such as 248 nm systems. In other embodiments, the layer 120 and any subsequent resist layers may be formed of a resist that can be patterned by nano-imprint lithography, e.g., by using a mold or mechanical force to pattern the resist.

Figure 7:
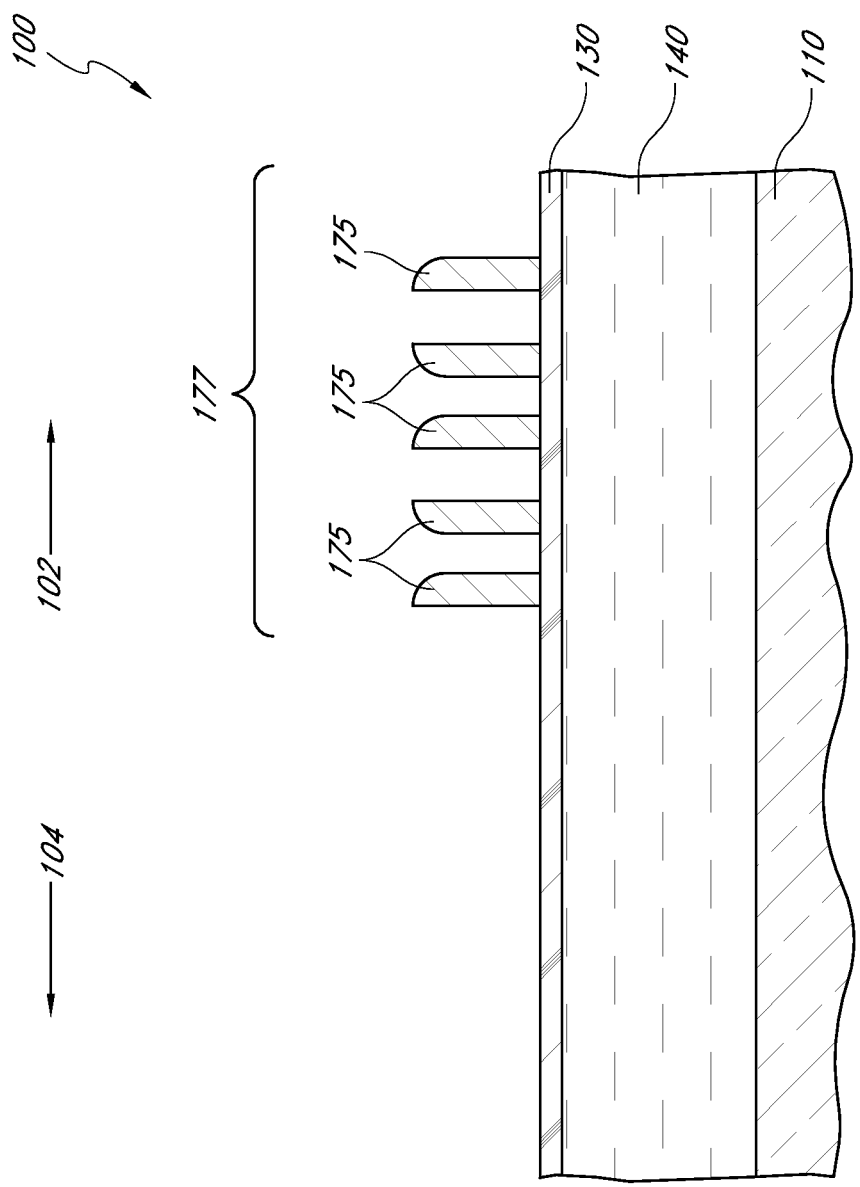
FIG. 7 is a schematic, cross-sectional side view of the partially formed integrated circuit of FIGS. 6A and 6B after removing a remaining portion of the temporary layer to leave a pattern of spacers in the array region of the integrated circuit, in accordance with embodiments of the invention.

In some embodiments, the material for the hard mask layer 130 comprises an inorganic material. Materials for the hard mask layer 130 include silicon oxide ($SiO_2$), silicon or an anti-reflective coating (ARC), such as a silicon-rich silicon oxynitride, a silicon-rich nitride, or a film that has the desired etch selectivity relative to the spacers 175 or other exposed materials (FIG. 7). The hard mask layer 130 can also include combinations of layers of materials, e.g., a bottom anti-reflective coating (BARC) over a dielectric anti-reflective coating (DARC). For ease of description, in the illustrated embodiment, the hard mask layer 130 is an anti-reflective coating, such as DARC. It will be appreciated that using ARCs for the hard mask layer 130 may be particularly advantageous for forming patterns having pitches near the resolution limits of a photolithographic technique. The ARCs can enhance resolution by minimizing light reflections, thus increasing the precision with which photolithography can define the edges of a pattern.

A combination of spin coated BARC over DARC can also be utilized. DARC can be deposited more conformally than BARC in some cases, thereby facilitating the formation of a planar surface for later photoresist deposition. BARC, however, can have superior properties in contact with photoresist. For example, photoresist features formed over BARC can have reduced "footing" (in which the part of the photoresist in contact with the BARC extends out laterally relative to the upper parts of the photoresist feature) relative to similar features formed over DARC.

With continued reference to FIG. 2B, the primary masking layer 140 is formed of amorphous carbon, which advantageously offers very high etch selectivity relative to many hard mask and substrate materials. It has been found that pitch multiplication techniques can encounter difficulty in transferring spacer patterns to a substrate. In common methods of transferring patterns, both the spacers and the underlying substrate are exposed to an etchant, which preferentially etches away the substrate material. The etchants, however, may also wear away the spacers, albeit at a slower rate. Thus, over the course of transferring a pattern to an underlying material, the etchant may wear away the spacers before the pattern transfer is complete. These difficulties are exacerbated by the trend towards decreasing feature size, which, for example, increasingly leads to the need to form trenches which have increasingly higher depth to width ratios. Thus, in conjunction with difficulties in producing structures having different feature sizes, pattern transfer limitations make the application of pitch multiplication principles to integrated circuit manufacture even more difficult.

Embodiments of the invention may utilize a primary masking layer to facilitate pattern transfer to a substrate. As noted above, in common methods of transferring patterns, both the mask and the underlying substrate are exposed to etchant, which may wear away a mask before the pattern transfer is complete. These difficulties are exacerbated where the substrate comprises multiple different materials to be etched. Due to its excellent etch selectivity relative to a variety of materials, including oxides, nitrides and silicon, the primary masking layer may be formed of amorphous carbon, including transparent carbon.

It will be appreciated that the "substrate" to which patterns are transferred may include a layer of a single material, a plurality of layers of different materials, a layer or layers having regions of different materials or structures in them, etc. These materials may include semiconductors, insulators, conductors, or combinations thereof. For example, the substrate may comprise doped polysilicon, an electrical device active area, a silicide, or a metal layer, such as a tungsten, aluminum or copper layer, or combinations thereof. In some embodiments, the mask features discussed below may directly correspond to the desired placement of conductive features, such as interconnects, in the substrate. In other embodiments, the substrate may be an insulator and the location of mask features can correspond to the desired location of insulators, such as in damascene metallization. Examples of structures formed in the substrate in some embodiments include gate stacks and shallow trench isolation structures.

In addition to selecting appropriate materials for the various layers, the thicknesses of the layers 120-140 are chosen depending upon compatibility with the etch chemistries and process conditions described herein. As discussed above, when transferring a pattern from an overlying layer to an underlying layer by selectively etching the underlying layer, materials from both layers are removed to some degree. Thus, the upper layer is thick enough so that it is not worn away over the course of the pattern transfer.

In the illustrated embodiment, the photodefinable layer 120 is about 50-300 nm thick or about 200-250 nm thick for forming features with about 100 nm resolution or about 50-150 nm thick for forming features with about 50-70 nm resolution. It will be appreciated that, in cases where the layer 120 is a photoresist, this thickness may vary depending upon the wavelength of light used to pattern the layer 120. A thickness of about 50-300 nm thick or about 200-250 nm thick is particularly advantageous for 248 nm wavelength systems.

In the illustrated embodiment, the hard mask layer 130 is about 30-40 nm thick or about 20-30 nm thick. It will be appreciated that the thickness of the hard mask layer 130 can vary depending upon the selectivity of etches used to etch the hard mask layer 130 and neighboring layers, and depending upon photo-exposure conditions.

As discussed above, the thickness of the primary mask layer 140 is chosen based upon the selectivity of the etch chemistry for etching the substrate and based upon the materials and complexity of the substrate. It has been found that a thickness of about 100-400 nm or about 200-300 nm is effective for transferring patterns to a variety of substrates, including substrates having a plurality of different materials to be etched during the transfer. In some embodiments, for patterns with pattern features having critical dimensions of about 25 nm or less, the thickness of the primary mask layer 140 may be about 100-200 nm.

Figure 2C:
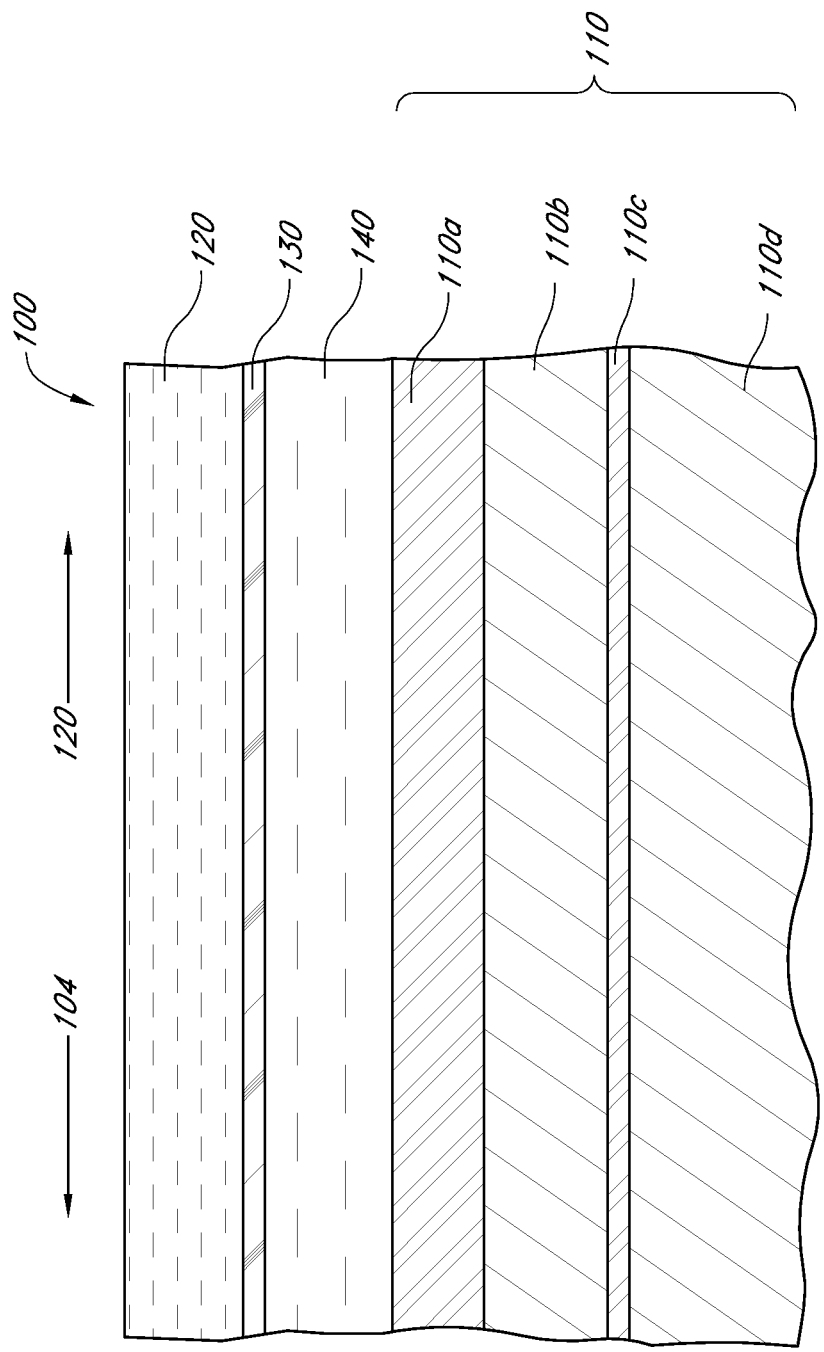

As an example of a substrate having a stack of layers, FIG. 2C shows a substrate 110 having a plurality of layers which may be etched to form control gates. A silicide layer 110a overlies a polysilicon layer 110b, which overlies an oxide-nitride-oxide (ONO) composite layer 110c, which overlies a polysilicon layer 110d. Additional layers may be inserted, or some layers may be omitted, as desired, depending upon the application.

The various layers discussed herein may be formed by various methods. For example, spin-on-coating processes may be used to form photodefinable layers. Various vapor deposition processes, such as chemical vapor deposition or atomic layer deposition, may be used to form hard mask layers. In some embodiments, the hard mask layer 130 is formed by low temperature deposition processes, performed at less than about 550° C. or at less than about 450° C. or at less than about 400° C. Processing at these low temperatures advantageously aids in maintaining the integrity of the primary masking layer 140, especially when that layer is formed of amorphous carbon. For example, undesirable ashing may occur if amorphous carbon is exposed to higher temperatures.

In addition, the amorphous carbon layers may be formed by chemical vapor deposition using a hydrocarbon compound, or mixtures of such compounds, as carbon precursors. Carbon precursors may include propylene, propyne, propane, butane, butylene, butadiene and acetelyne. A method for forming amorphous carbon layers is described in U.S. Pat. No. 6,573,030 B1, issued to Fairbairn et al. on Jun. 3, 2003, the entire disclosure of which is incorporated herein by reference. In some embodiments, the amorphous carbon is a form of amorphous carbon that is highly transparent to light and that offers further improvements for photo alignment by being transparent to the wavelengths of light used for such alignment. Deposition techniques for forming such transparent carbon can be found in A. Helmbold, D. Meissner, Thin Solid Films, 283 (1996) 196-203, the entire disclosure of which is incorporated herein by reference. In addition, the amorphous carbon may be doped. A suitable method for forming doped amorphous carbon is described in U.S. patent application Ser. No. 10/652,174 to Yin et al., the entire disclosure of which is incorporated herein by reference.

Figure 3A:
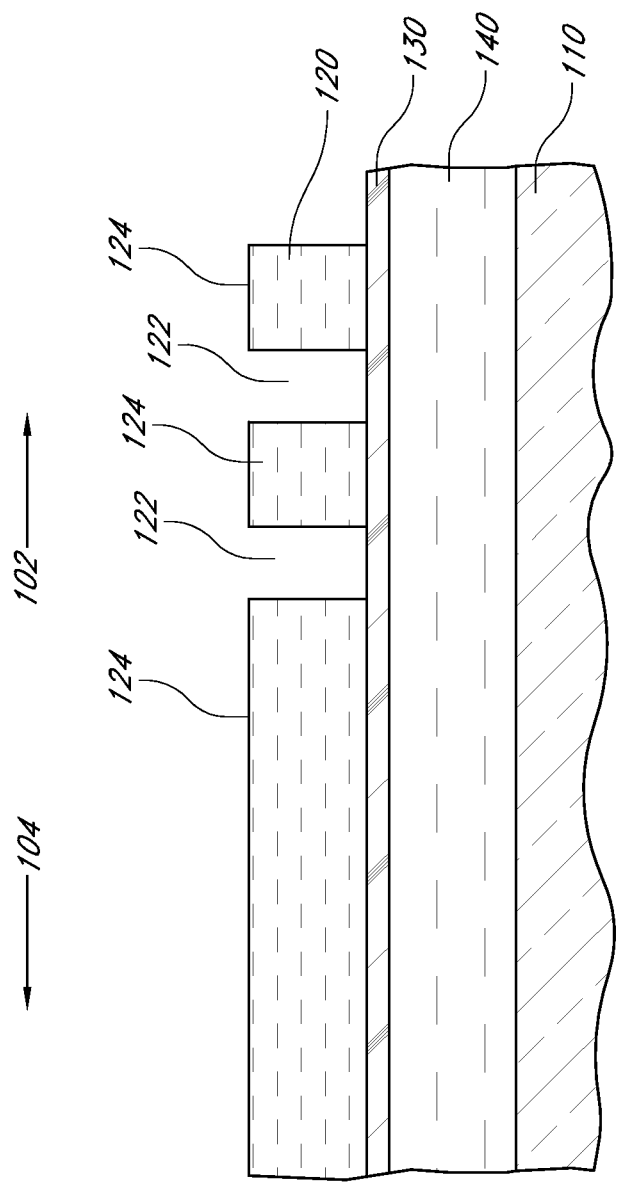
FIGS. 3A and 3B are schematic cross-sectional side and top plan views of the partially formed integrated circuit of FIGS. 2A-2C after forming lines in a photoresist layer in an array region of the integrated circuit, in accordance with embodiments of the invention.
Figure 3B:
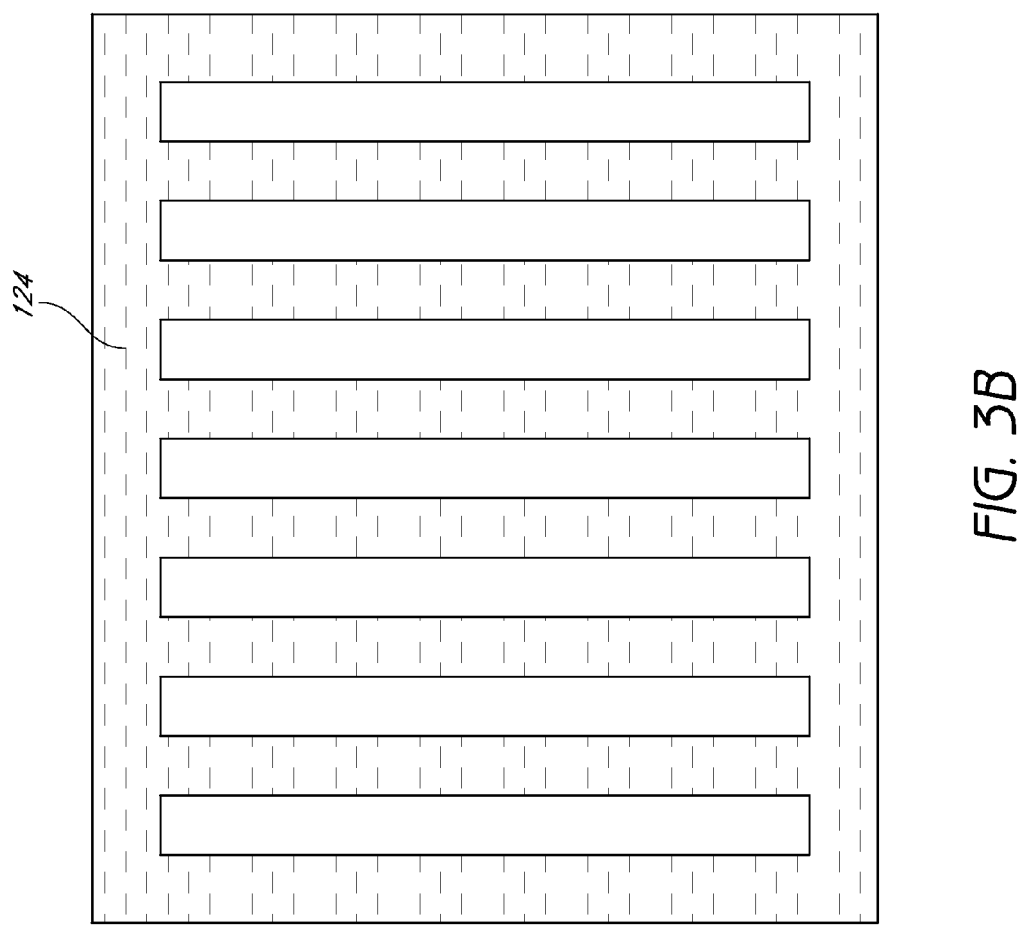

With reference to FIGS. 3A and 3B, a pattern comprising spaces or trenches 122, which are delimited by photodefinable material features 124, is formed in the photodefinable layer 120. The trenches 122 may be formed by, e.g., photolithography with 248 nm or 193 nm light, in which the layer 120 is exposed to radiation through a reticle and then developed. After being developed, the remaining photodefinable material, photoresist in the illustrated embodiment, forms mask features such as the illustrated lines 124 (shown in cross-section only).

The pitch of the resulting lines 124 is equal to the sum of the width of a line 124 and the width of a neighboring space 122. To minimize the critical dimensions of features formed using this pattern of lines 124 and spaces 122, the pitch may be at or near the limits of the photolithographic technique used to pattern the photodefinable layer 120. For example, for photolithography utilizing 248 nm light, the pitch of the lines 124 may be about 100 nm. Thus, the pitch may be at the minimum pitch of the photolithographic technique and the spacer pattern discussed below may advantageously have a pitch below the minimum pitch of the photolithographic technique. Alternatively, because the margin of error for position and feature size typically increases as the limits of a photolithographic technique are approached, the lines 124 may be formed having larger feature sizes, e.g., 200 nm or more, to minimize errors in the position and sizes of the lines 124.

Figure 4A:
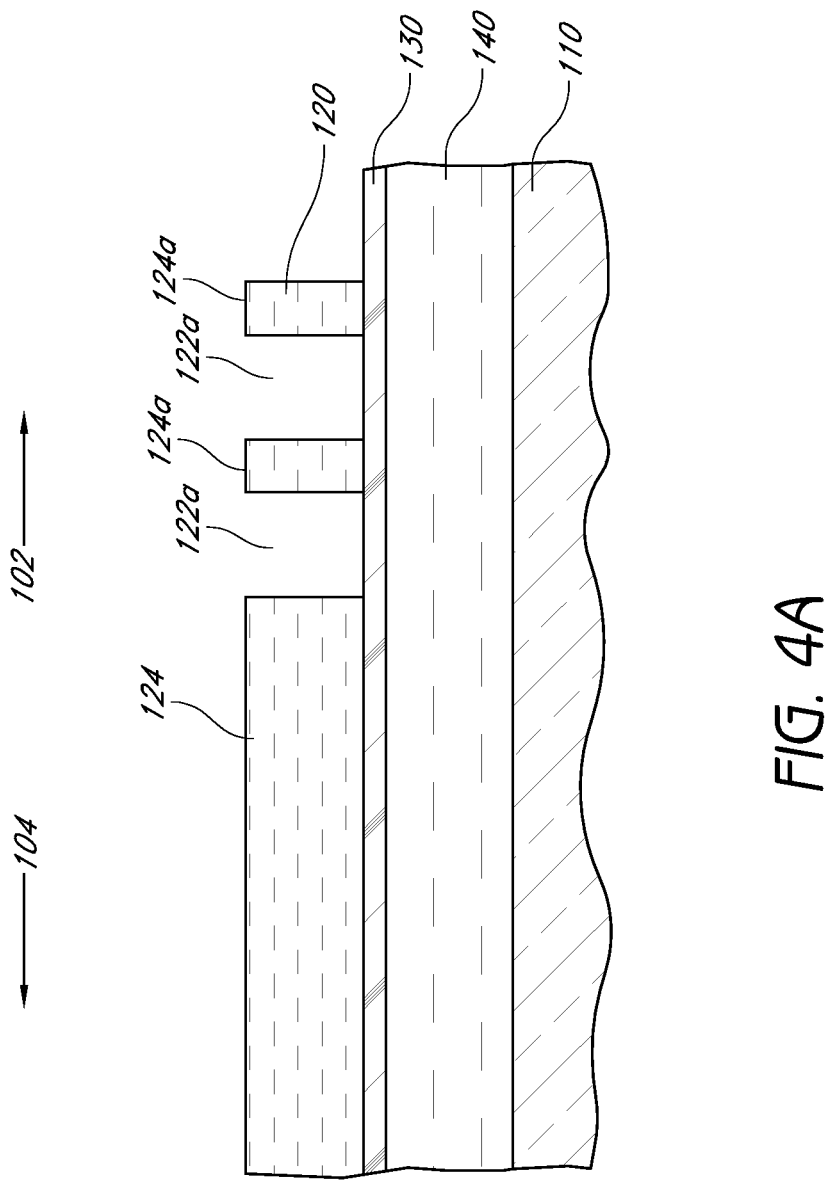
FIGS. 4A and 4B are schematic cross-sectional side and top plan views of the partially formed integrated circuit of FIGS. 3A and 3B after widening spaces between lines in the photoresist layer, in accordance with embodiments of the invention.
Figure 4B:
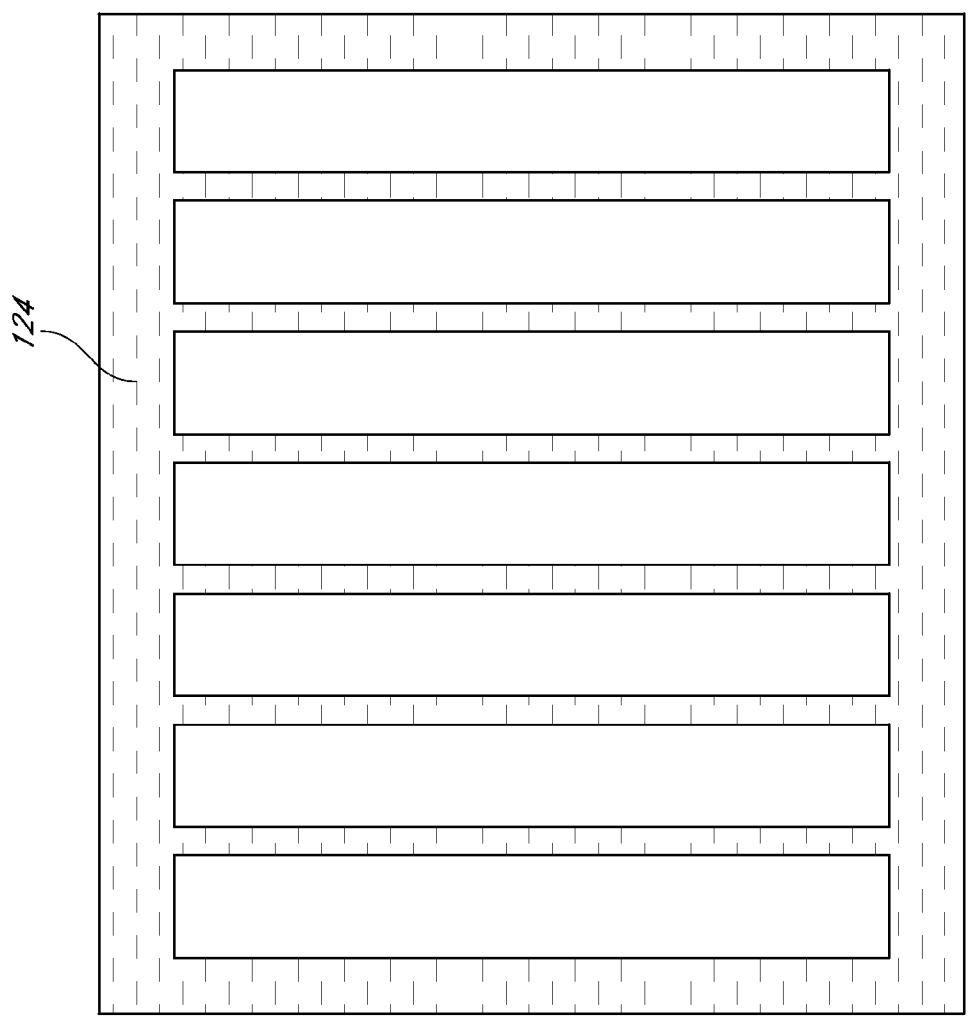

As shown in FIGS. 4A and 4B, the spaces 122 are widened by etching the photoresist lines 124, to form modified spaces 122a and lines 124a. The photoresist lines 124 are etched using an isotropic etch to "shrink" or trim those features. Suitable etches include etches using an oxygen-containing plasma, e.g., a $SO_2/O_2/N_2/Ar$ plasma, a $Cl_2/O_2/He$ plasma or a $HBr/O_2/N_2$ plasma. The extent of the etch is selected so that the widths of the lines 124a are substantially equal to the desired spacing between the later-formed spacers 175 (FIG. 7), as will be appreciated from the discussion below. For example, the width of the lines 124 may be reduced from about 80-120 nm to about 30-70 nm or about 50-70 nm. Advantageously, the width-reducing etch allows the lines 124a to be narrower than would otherwise be possible using the photolithographic technique used to pattern the photodefinable layer 120. In addition, the etch may smooth the edges of the lines 124a, thus improving the uniformity of those lines. While the critical dimensions of the lines 124a may be etched below the resolution limits of the photolithographic technique, it will be appreciated that this etch does not alter the pitch of the spaces 122a and lines 124a, since the distance between identical points in these features remains the same.

Figure 5:
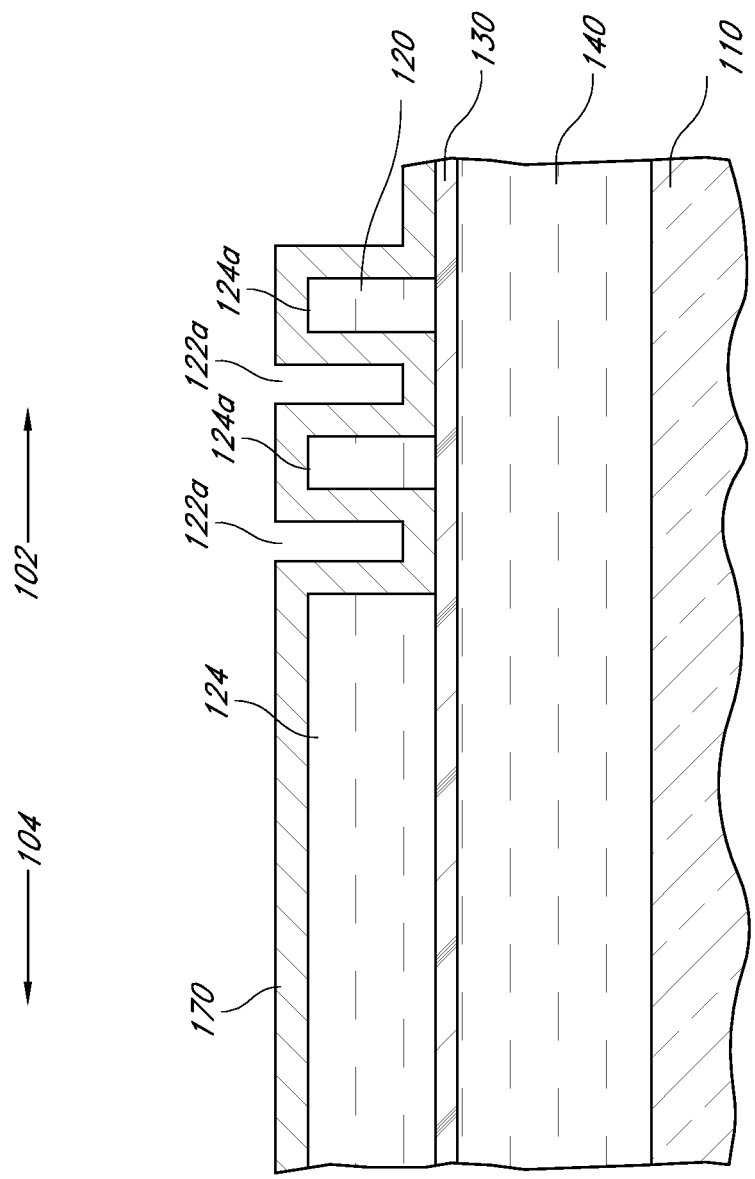
FIG. 5 is a schematic, cross-sectional side view of the partially formed integrated circuit of FIGS. 4A and 4B after depositing a layer of a spacer material, in accordance with embodiments of the invention.

Next, with reference to FIG. 5, a layer 170 of spacer material is blanket deposited conformally over exposed surfaces, including the hard mask layer 150 and the top and sidewalls of the temporary layer 140. The spacer material may be any material that can act as a mask for transferring a pattern to the underlying hard mask layer 130. The spacer material: 1) may be deposited with good step coverage; 2) may be deposited at a temperature compatible with the selectively definable layer 110; and 3) may be selectively etched relative to the selectively definable layer 110 and underlying hard mask layer 130. The spacer material may be, without limitation, silicon, silicon oxide and silicon nitride. In the illustrated embodiment, the spacer material is silicon oxide, which provides particular advantages in combination with other selected materials of the masking stack.

Methods for spacer material deposition include atomic layer deposition, e.g., using a self-limiting deposition with a silicon precursor and a subsequent exposure to an oxygen or nitrogen precursor to form silicon oxides and nitrides, respectively. In some embodiments, to form silicon oxide, a silicon halide, such as silicon hexachlorodisilane (HCD), is introduced in alternating pulses with an oxygen precursor, such as $H_2O$. ALD can be performed at relatively low temperatures, e.g., under about 200° C. or under about 100° C., which has advantages for preventing thermal damage to underlying carbon-based materials, such as photoresist and amorphous carbon layers. In other embodiments, chemical vapor deposition is used to deposit the spacer material, e.g., using $O_3$ and TEOS to form silicon oxide.

The thickness of the layer 170 is determined based upon the desired width of the spacers 175 (FIG. 7). For example, in some embodiments, the layer 170 is deposited to a thickness of about 20-80 nm or about 40-60 nm to form spacers of roughly similar widths. The step coverage is about 80% or greater and or about 90% or greater.

Figure 6A:
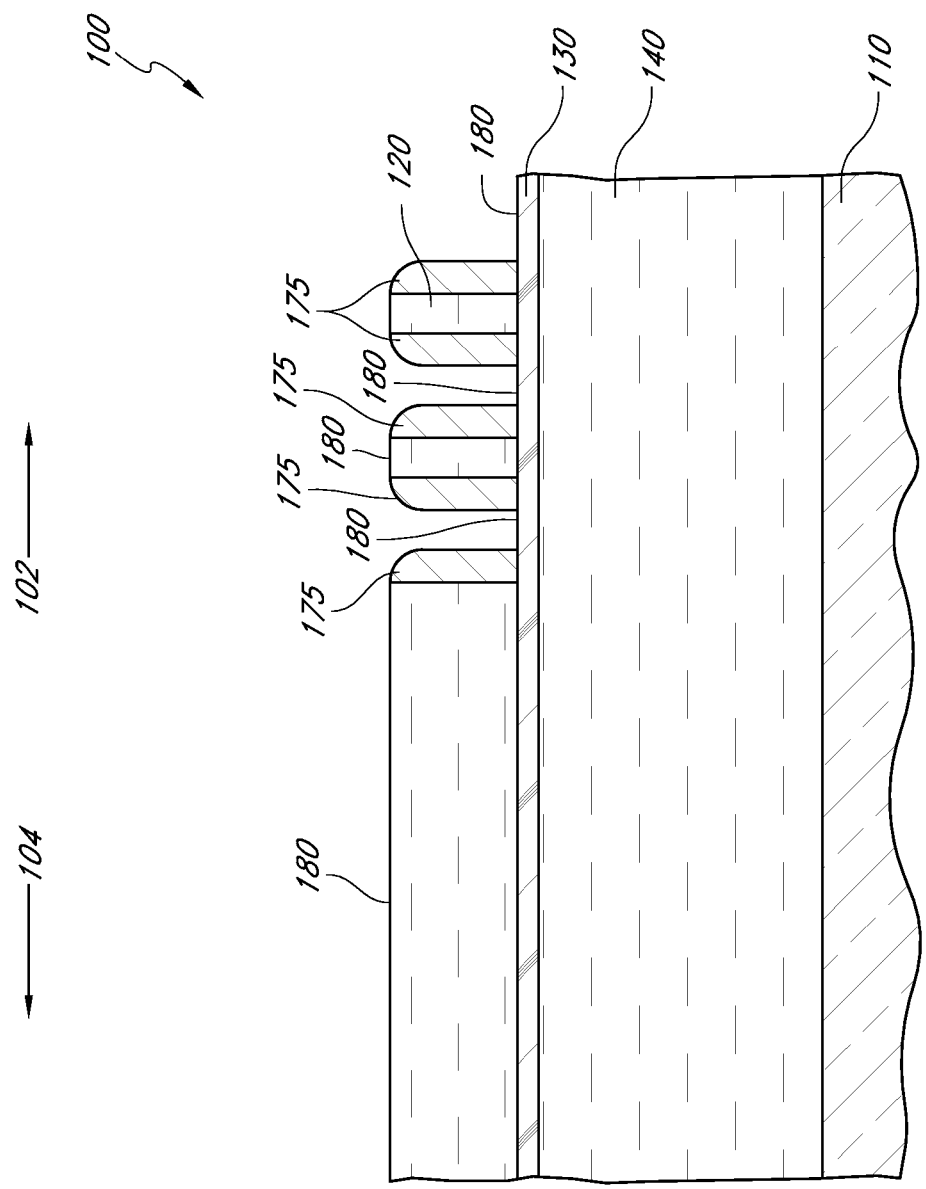
FIGS. 6A and 6B are schematic, cross-sectional side and top plan views of the partially formed integrated circuit of FIG. 5 after a spacer etch, in accordance with embodiments of the invention.
Figure 6B:
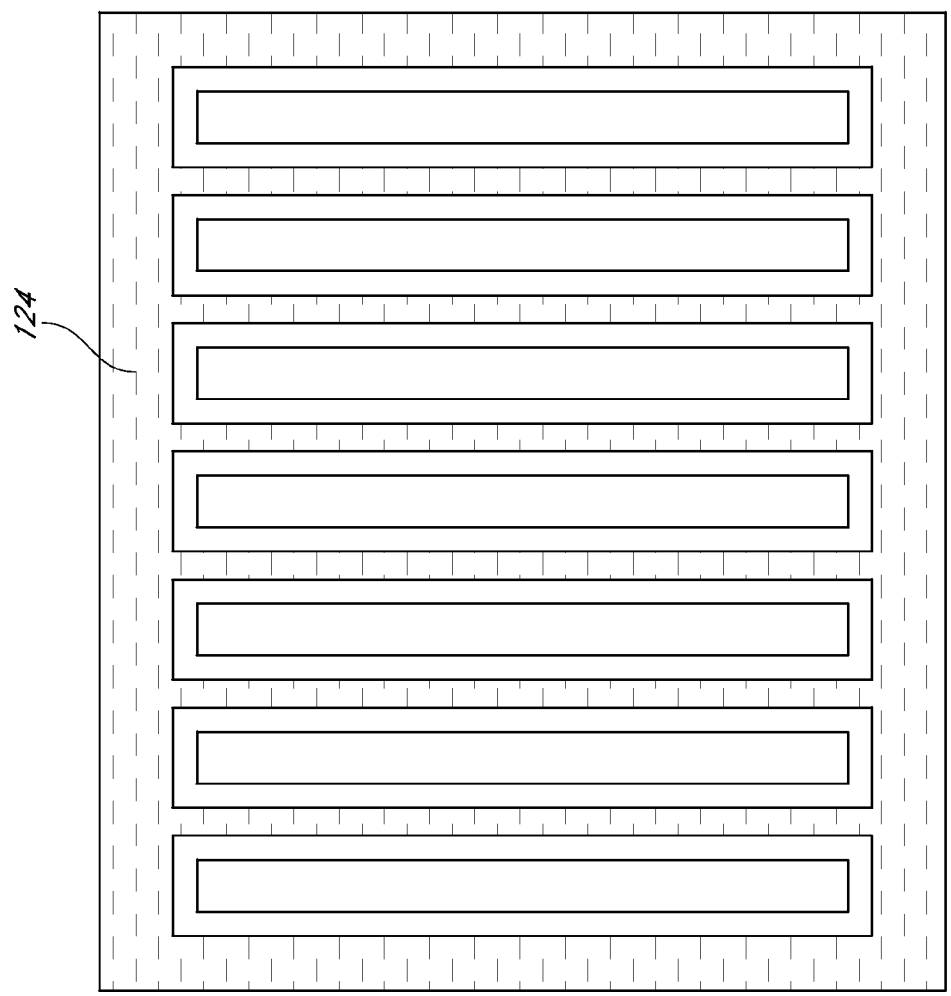

With reference to FIGS. 6A and 6B, the silicon oxide spacer layer 170 is subjected to an anisotropic etch to remove spacer material from horizontal surfaces 180 of the partially formed integrated circuit 100. Such an etch, also known as a spacer etch, may be performed using a fluorocarbon plasma, e.g., containing $CF_4/CHF_3$, $C_4F_8/CH_2F_2$ or $CHF_3/Ar$ plasma.

With reference to FIG. 7, the selectively definable layer 120 is next removed to leave freestanding spacers 175. The selectively definable layer 120 is selectively removed using an organic strip process. Etch chemistries include, without limitation, a oxygen-containing plasma etch, such as an etch using $SO_2$.

Thus, pitch-multiplied mask features have been formed. In the illustrated embodiment, the pitch of the spacers 175 is roughly half that of the photoresist lines 124 and spaces 122 (FIG. 3A) originally formed by photolithography. Where the photoresist lines 124 had a pitch of about 200 nm, spacers 175 having a pitch of about 100 nm or less may be formed. It will be appreciated that because the spacers 175 are formed on the sidewalls of the features or lines 124b, the spacers 175 generally follow the outline of the pattern of features or lines 124a in the modified photodefinable layer 120a and, so, typically form a closed loop in the spaces 122a between the lines 124a. The spacers 175 form a first pattern 177.

Next, in a second phase of methods according to embodiments of the invention, a second pattern is overlaid the first pattern 177. The second pattern may include features having larger widths than the first pattern 177. In addition, the second pattern may be formed completely, partially, or not overlapping the first pattern 177.

Figure 8:
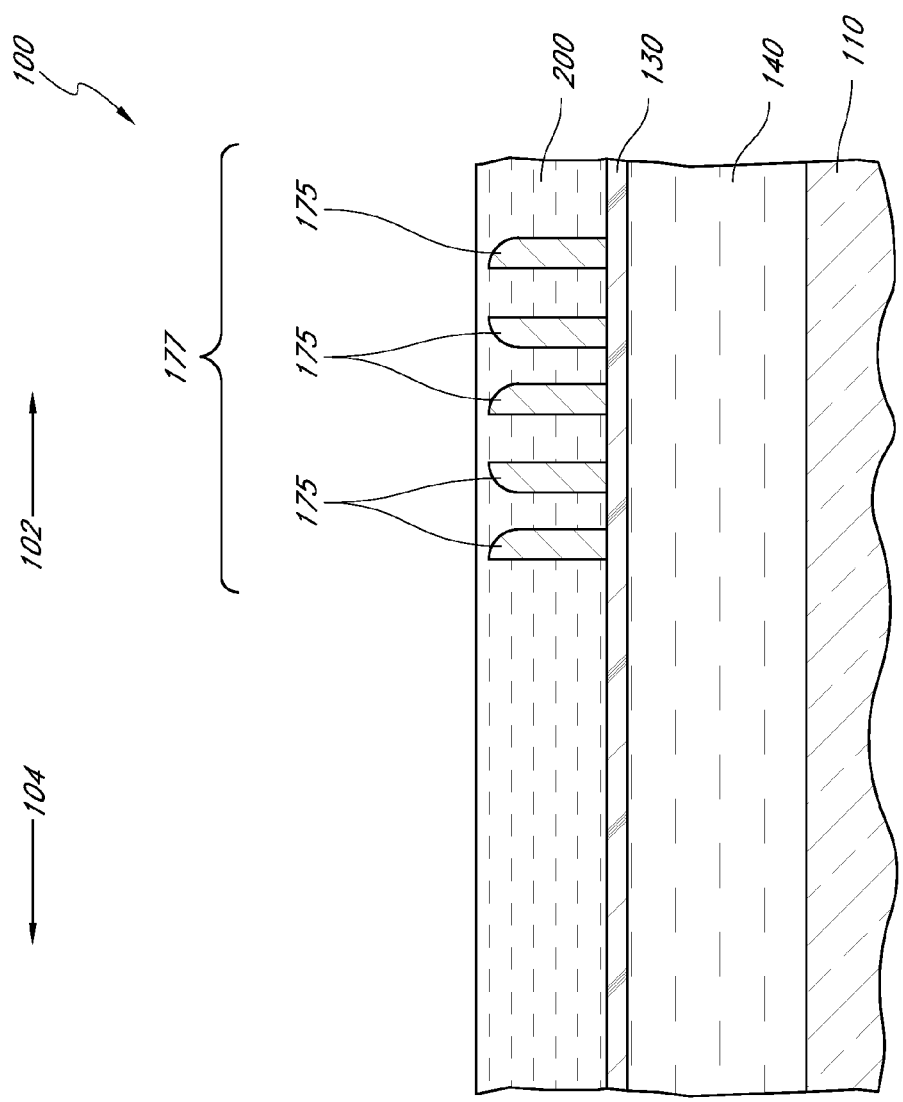
FIG. 8 is a schematic, cross-sectional side view of the partially formed integrated circuit of FIG. 7 after depositing a negative photoresist layer between and over the spacers, in accordance with embodiments of the invention.

With reference to FIG. 8, a negative photoresist layer 200 is deposited between and over the pitch-multiplied mask features, the spacers 175 in the illustrated embodiment. In embodiments of the invention, the negative photoresist layer 200 extends above an uppermost part of the spacers 175 to provide a substantially planar surface, which has advantages for improving photolithography results relative to an uneven surface by, e.g., reducing shadows that may be caused by uneven topography.

Figure 9:
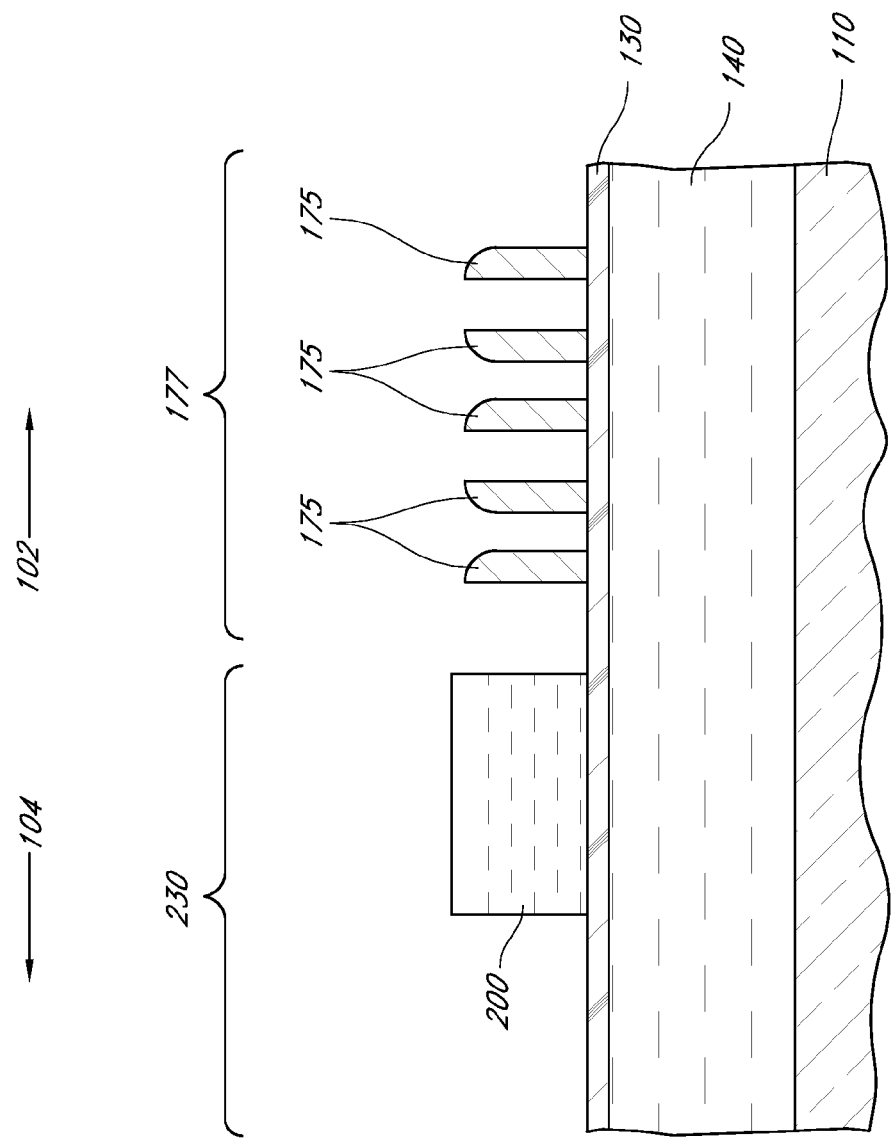
FIG. 9 is a schematic, cross-sectional side view of the partially formed integrated circuit of FIG. 8 after forming a pattern in the negative photoresist layer, in accordance with embodiments of the invention.

With reference to FIG. 9, the photodefinable layer 200 is patterned by photolithography. The negative photoresist layer 200 may be patterned by exposure to radiation through a reticle and then developed. For example, the negative photoresist may be exposed to an intensity of light that would cause undesired cross-linking of positive photoresist between silicon oxide spacers. In some embodiments, the negative photoresist may be exposed to light have an intensity of about 20 mJ/cm$^2$ or more.

With continued reference to FIG. 9, a pattern 230 is formed in the photodefinable layer 200. Where the pattern 230 is used to define features in the periphery 104, the area in the photodefinable layer 220 in the array 102 is open, as illustrated. As noted above, however, while illustrated laterally adjacent the pattern 177, the pattern 230 may partially or completely overlap the pattern 177 or be completely separated from the pattern 177. Thus, the use of different reference numerals (177 and 230) for these patterns indicates that they were originally formed in different steps.

While the pattern 177 has a pitch or feature size smaller than the minimum pitch or resolution of the photolithographic technique used in forming it, the pattern 230 typically has a pitch or feature size equal to or greater than the minimum pitch or resolution of the photolithographic technique used to form that pattern. It will be appreciated that the pattern 230 at the periphery 104 may be used to form landing pads, transistors, local interconnects, etc.

Next, in a third phase according to embodiment of the invention, the patterns 177 and 230 are transferred to a level below the spacers and simultaneously transferred to the substrate 110.

In any of the steps described herein, transferring a pattern from an overlying level to an underlying level involves forming features in the underlying level that generally correspond to features in the overlying level. For example, the path of lines in the underlying level will generally follow the path of lines in the overlying level and the location of other features in the underlying level will correspond to the location of similar features in the overlying level. The precise shapes and sizes of features may vary from the overlying level to the underlying level, however. For example, depending upon etch chemistries and conditions, the sizes of and relative spacings between the features forming the transferred pattern may be enlarged or diminished relative to the pattern on the overlying level, while still resembling the same initial "pattern," as can be seen from the example of shrinking the first resist mask in the embodiments described below. Thus, even with some changes in the dimensions of features, the transferred pattern is still considered to be the same pattern as the initial pattern. In contrast, forming spacers around mask features may change the pattern.

Figure 10:
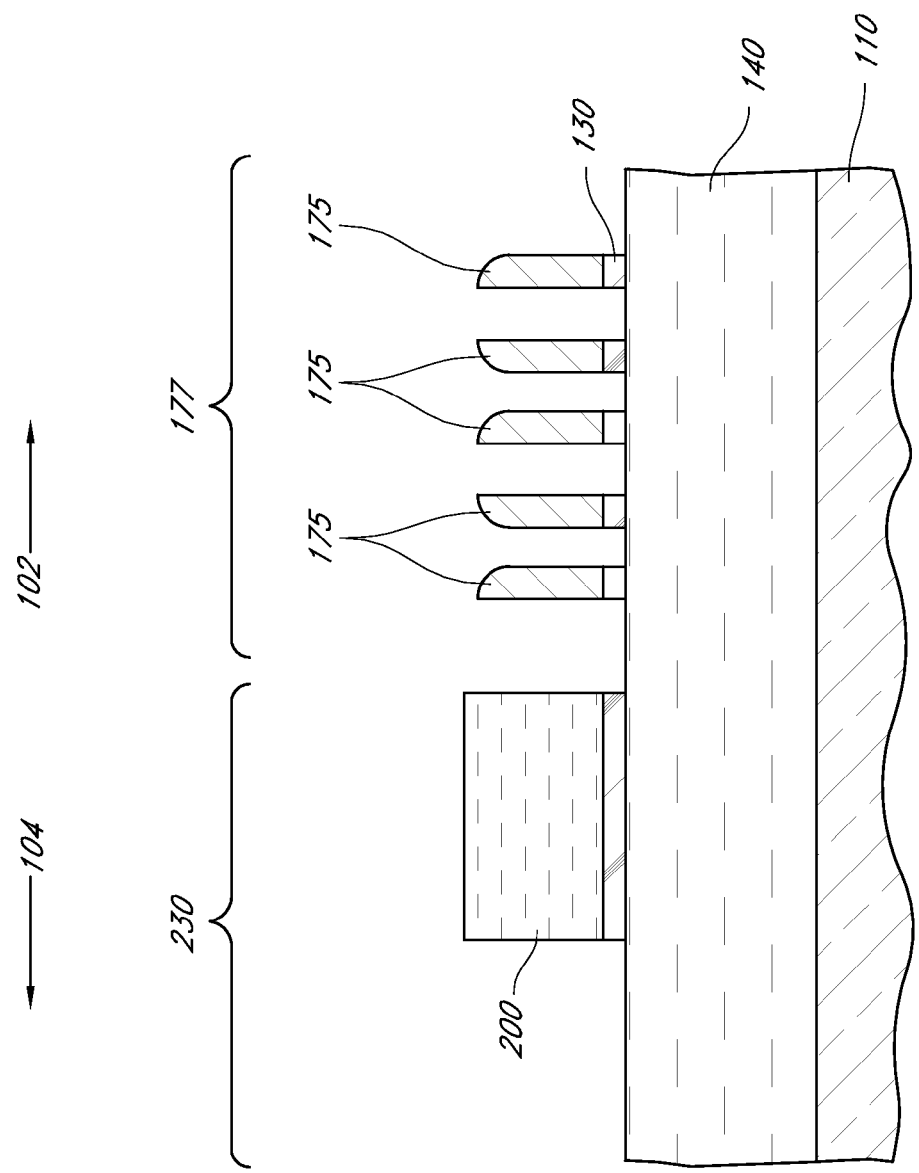
FIG. 10 is a schematic, cross-sectional side view of the partially formed integrated circuit of FIG. 9 after transferring a combined pattern defined by the negative photoresist layer and the spacers to an underlying hard mask layer, in accordance with embodiments of the invention.

With reference to FIG. 10, the patterns 177 and 230 are both transferred to the hard mask layer 130. Where the hard mask 130 is formed of DARC, it may be anisotropically etched using, e.g., an oxygen-containing plasma. The plasma etch chemistries include, without limitation, a $HBr/O_2$ plasma or a $SO_2$-containing plasma.

With continued reference to FIG. 10, the first and second patterns 177 and 230 may be cleaned. As noted above, the carbon material forming the photoresist layer 200 may polymerize upon contact with etchants. For example, the etch of the hard mask layer 130 may cause parts of the photoresist layer 200 to polymerize and leave a residue around features in the hard mask layer 130, causing a pattern having undesirably non-uniform features. Thus, the patterns 177 and 230 may be cleaned by stripping off an organic material. The strip may be accomplished using, e.g., an isotropic etch with $O_2$ plasma or $NH_3/O_2$ plasma. In some embodiments, an etch stop layer may be provided below the hard mask layer to protect underlying layers from etchants used in the cleaning step.

Figure 11:
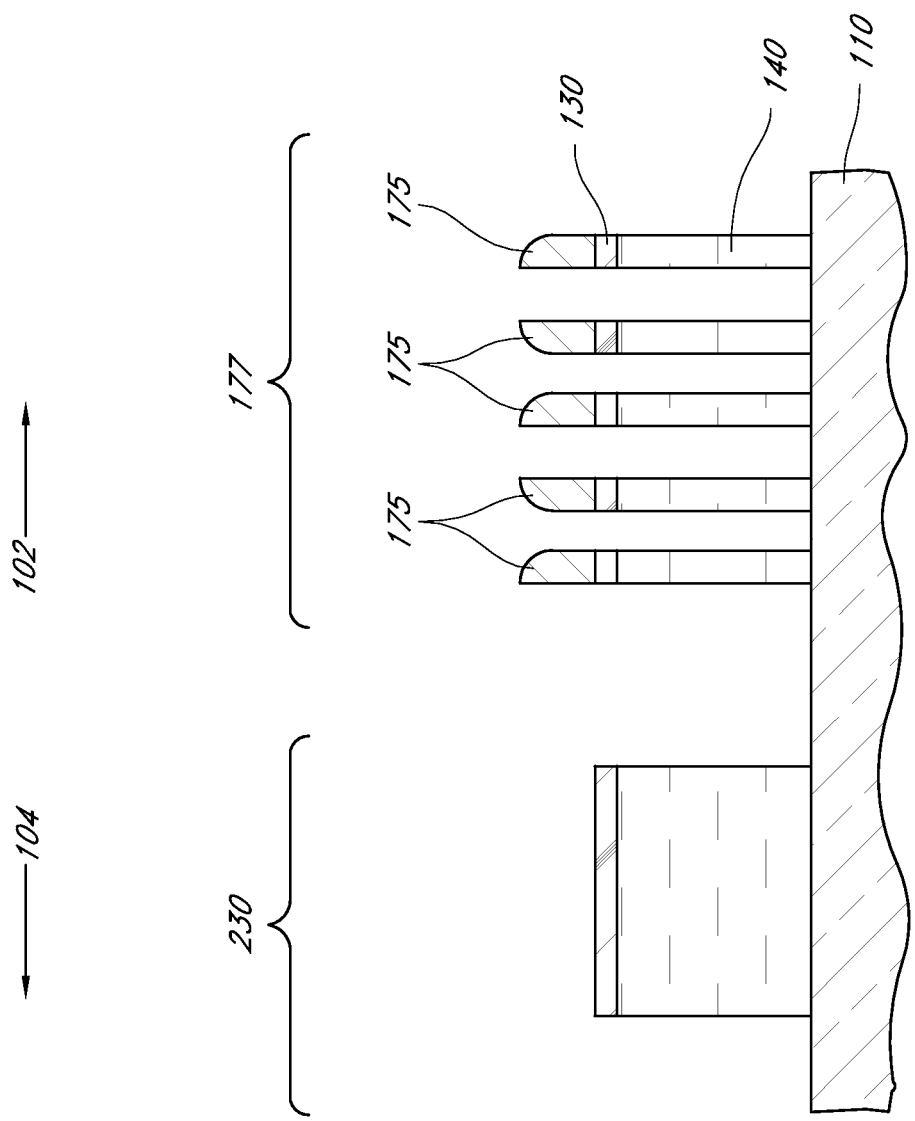
FIG. 11 is a schematic, cross-sectional side view of the partially formed integrated circuit of FIG. 10 after transferring the combined pattern to a primary mask layer, in accordance with embodiments of the invention.

With reference to FIG. 11, the patterns 177 and 230 are transferred to the primary mask layer 140. The transfer is accomplished by anisotropically etching the primary mask layer 140, using, e.g., a $SO_2$-containing plasma. Other etch chemistries include, without limitation, a $Cl_2/O_2$, $HBr/O_2/N_2$ or $SiCl_4/O_2/N_2/HBr$ or $SiCl_4/O_2$-containing plasma. As noted above, the $SO_2$-containing plasma is used as it has been found to have excellent selectivity for the amorphous carbon of the primary mask layer 140 relative to the spacers 175 and the hard mask layer 130. Thus, a thick enough mask may be formed in the primary mask layer 140 to later effectively transfer the mask pattern to the substrate 110, particularly through multiple materials of the substrate 110 using selective etch chemistries and without wearing away the primary mask layer 140 before the pattern transfer is complete.

Figure 12:
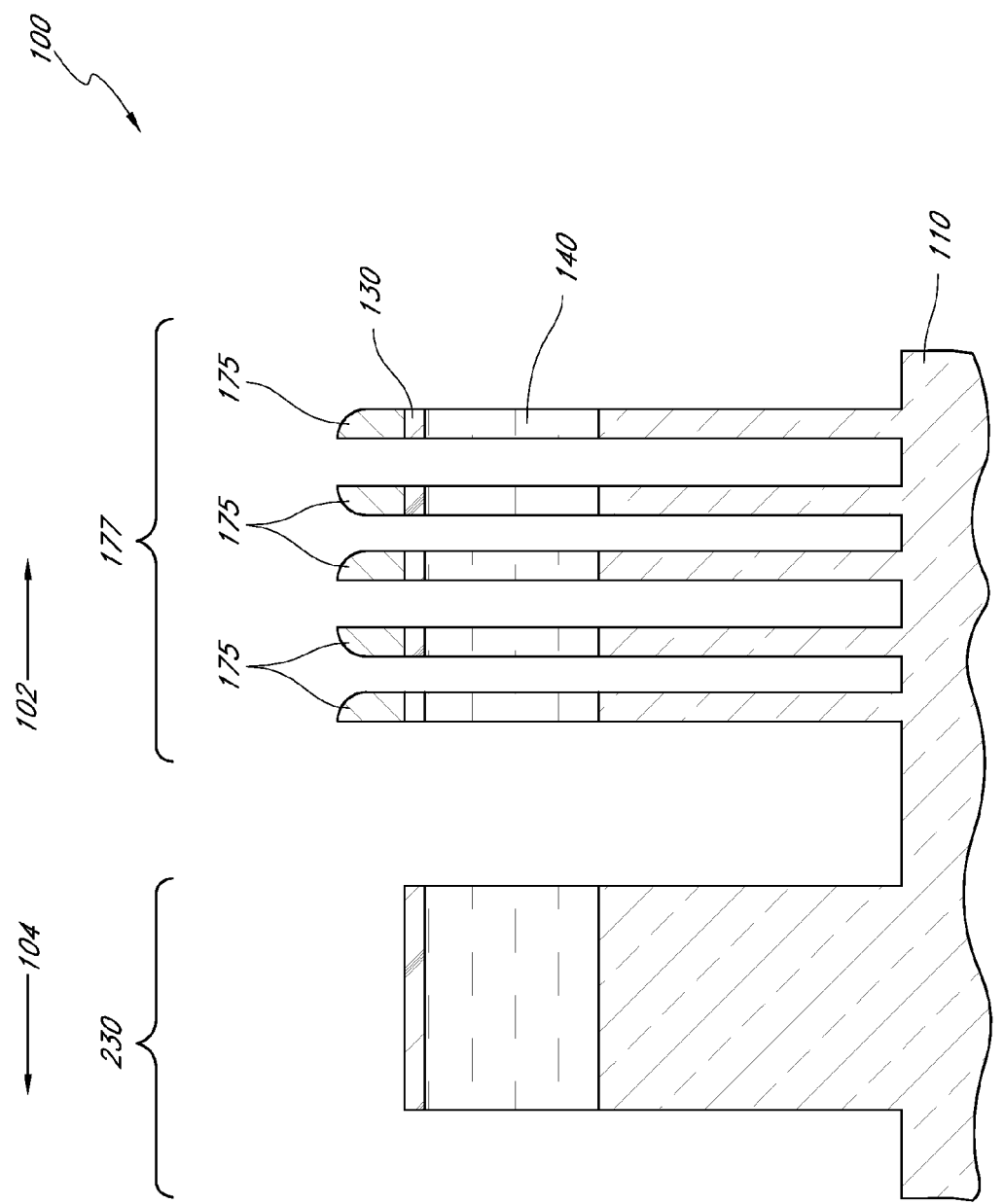
FIG. 12 is a schematic, cross-sectional side view of the partially formed integrated circuit of FIG. 11 after transferring the combined pattern to the underlying substrate, in accordance with embodiments of the invention.

With reference to FIG. 12, after being transferred to the primary mask layer 140, the patterns 177 and 230 are transferred to the substrate 110 using the layer 140 as a mask. Given the disparate materials typically used for the primary mask layer 140 and the substrate 110 (e.g., amorphous carbon and silicon or silicon compounds, respectively), the pattern transfer may be readily accomplished using etch chemistries appropriate for etching the material or materials of the substrate 110. For example, a fluorocarbon etch comprising $CF_4$, $CHF_3$ and/or $NF_3$ containing plasma may be used to etch silicon nitride, a fluorocarbon etch comprising $CF_4$, $CHF_3$, $CH_2F_2$ and/or $C_4F_8$ containing plasma may be used to etch silicon oxide and a HBr, $Cl_2$, $NF_3$, $SF_6$ and/or $CF_4$ containing plasma etch may be used to etch silicon. In addition, the skilled artisan can readily determine suitable etch chemistries for other substrate materials, such as conductors, including aluminum, transition metals, and transition metal nitrides, or insulators, such as oxides and low-k dielectrics. For example, an aluminum substrate may be etched using a fluorocarbon etch. In one example, the sequence of substrate layers 110a-110d may be etched using various etch chemistries, which anisotropically etch the various layers. The silicide layer 110a may be etched using a $Cl_2/CF_4$ plasma; the polysilicon layer 110b may etched be using a $HBr/Cl_2$ plasma; the oxide-nitride-oxide (ONO) composite layer 110c may be etched using a $CF_4/CH_2F_2/He$ plasma; and the polysilicon layer 110d may be etched using a $HBr/He/O_2$ plasma It will be appreciated that where the substrate 110 comprises layers of different materials, a succession of different chemistries, e.g., dry-etch chemistries, may be used to successively etch through these different layers, if a single chemistry is not sufficient to etch all the different materials. It will also be appreciated that, depending upon the chemistry or chemistries used, the spacers 175 and the hard mask layer 130 may be etched. Using amorphous carbon for the primary mask layer 140, however, offers excellent resistance to conventional etch chemistries, especially those used for etching silicon-containing materials. Thus, the primary mask layer 140 may effectively be used as a mask for etching through a plurality of substrate layers, or for forming high aspect ratio trenches. In addition, the pitch doubled pattern 177 and the pattern 230 formed by conventional lithography may simultaneously be transferred to the substrate 110, or each individual layer of the substrate 110, in a single etch step.

Figure 13:
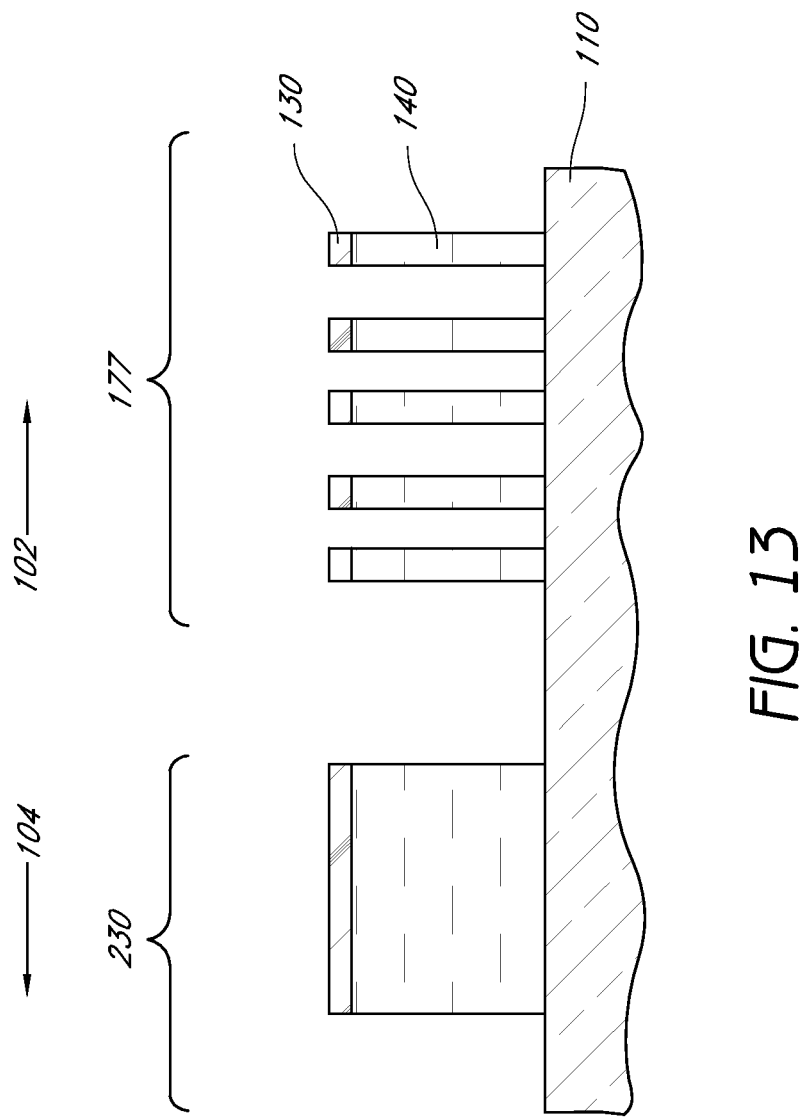
FIG. 13 is a schematic, cross-sectional side view of the partially formed integrated circuit of FIG. 11 after performing a spacer removal and before transferring the pattern into the substrate, in accordance with embodiments of the invention.

With reference to FIG. 13, in some embodiments, the spacers 175 may be removed before using the primary mask layer 140 to transfer the patterns 177 and 230 to the substrate 110. While the primary mask layer is appropriately thick so that it is not worn away before the pattern transfer is complete, it will be appreciated that the spacers 175 and the hard mask layer 130 typically also overlie the primary mask layer 140 when etching the substrate 110. It has been found, however, that, in cases where the primary mask layer is particularly thick and/or the mask features are very thin, the relatively tall and thin features in the mask may not be structurally stable. As a result, the mask features may deform. Thus, an optional spacer or spacer and hard mask removal may be performed to straighten, stabilize and reduce the profile of the mask features before transfer of the pattern to the substrate. The removal is performed using an etch selective for the spacers 175. For example, where the spacers 175 comprise a silicon oxide, the spacer removal may be accomplished using a wet or dry etch, e.g., a wet buffered oxide etch or a dry etch using a $CH_2F_2/C_4F_8/Ar/O_2$ plasma. As noted above, this spacer removal may advantageously straighten and/or stabilize the profile of the features forming the patterns 177 and 230, especially where the features are taller than optimal for etching the substrate 110. In other embodiments, the material forming the spacers 175 are chosen with structural properties suitable for forming stable high aspect ratio structures, so that the spacers 175 may be retained during etching the substrate.

Figure 14:
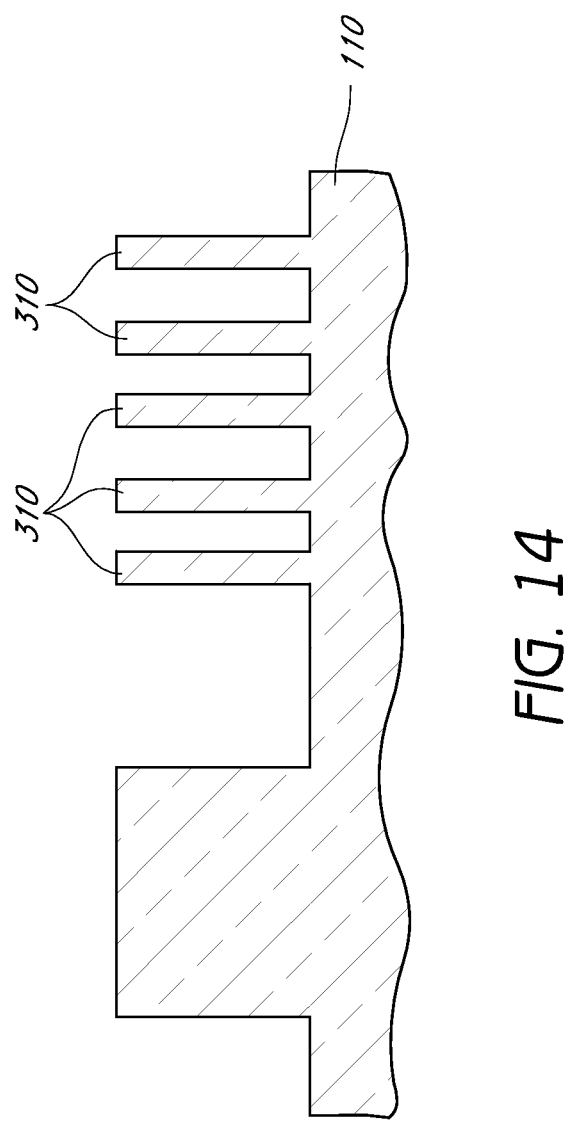
FIG. 14 is a schematic, cross-sectional side view of the partially formed integrated circuit of FIG. 12 or 13 after transferring the pattern into the substrate and removing hard mask layers overlying the sustrate, in accordance with embodiments of the invention.

With reference to FIG. 14, the patterns 177 and 230 are transferred to the substrate 110. In the illustrated embodiment, the patterns 177 and 230 are etched into the substrate 110 and overlying mask layers are removed. Pitch multiplied features 310 are formed in the substrate 110.

Transferring the patterns 177 and 230 into the substrate can define various features or electrical devices. For example, the substrate 110 can be etched through the patterns 177 and 230 to form a pattern of trenches. The trenches may be used in damascene processing to form, e.g., electrical interconnects such as word lines and bit lines, by filling the trenches with conductive material. Where the substrate 10 is a conductor, the un-etched conductive material may constitute the electrical interconnects.

Trenches defined by etching the substrate 110 may also be filled with insulating material, e.g., silicon oxide, for shall trench isolation applications. Memory cell active areas, such as for flash memory, may be defined between the trenches and floating and control gates may be formed over the active areas.

In some embodiments, the patterns 177 and 230 may be used to define gate structures in the substrate 110. For example, floating and/or control gates may be defined by etching through a sequence of layers, which will form the floating and/or control gates. Insulating material, e.g., silicon oxide, can later be deposited between the gate structures for electrical isolation. Alternatively, the patterns 177 and 230 can be transferred to an insulator layer to form trenches, which can then be filled with one or more conductors.

It will be appreciated that the formation of patterns according to embodiments of the invention offer numerous advantages. For example, because multiple patterns, with differently-sized features, may be consolidated on a single final mask layer before being transferred to a substrate, overlapping patterns may easily be transferred to the substrate. Thus, pitch-multiplied features and features formed by conventional photolithography may easily be formed connected to each other. In addition, the ease of removal of negative photoresist allows photoresist to be deposited directly on exceptionally small, pitch-multiplied features, e.g., features having a pitch of about 100 nm or less or about 60 nm or 50 nm or less, so that conventional photolithography can be used to define a mask on the same level as the pitch-multiplied features.

It will also be appreciated that various modifications of the illustrated process flow are possible. For example, pitch multiplied patterns typically formed closed loops, since the patterns are formed by spacers that are formed along the walls of a mandrel. Consequently, where the pitch multiplied pattern is used to form conductive lines, additional processing steps may be used to cut off the ends of these loops, so that each loop forms two individual, non-connected lines. This may be accomplished, for example, by forming a protective mask around the parts of the lines to be maintained, while etching away the unprotected ends of the masks. A suitable method for cutting off the ends of the loops is disclosed in U.S. Pat. No. 7,151,040 to Tran et al., issued Dec. 19, 2006, the entire disclosure of which is incorporated be reference herein.

In some embodiments, the transfer of the end portions of the spacers to a lower level is blocked by appropriate patterning of an overlaid pattern, such as that formed in the layer 200. As a result, the transferred pattern does not contain loops, since the transfer of the loop ends can be blocked as desired by the overlaid pattern.

While shown deposited over and between pitch-multiplied spacers, negative resist can be applied to overlay a pattern over any pitch-multiplied feature. For example, the pattern 177 can be transferred to lower hard mask layers, or to a substrate, before negative photoresist is deposited on the pitch-multiplied features and patterned to form other features. The negative photoresist can be used to protect patterned features in an array region while other features are formed or patterned in a periphery region. For example, contacts or electrodes may be formed in the periphery region or the substrate may be doped through the mask formed by the negative photoresist.

It will also be appreciated that the pitch of the pattern 177 may be more than doubled. For example, the pattern 177 may be further pitch multiplied by forming spacers around the spacers 175, then removing the spacers 175, then forming spacers around the spacers that were formerly around the spacers 175, and so on. An exemplary method for further pitch multiplication is discussed in U.S. Pat. No. 5,328,810 to Lowrey et al. In addition, while embodiments of the invention may advantageously be applied to form patterns having both pitch multiplied and conventionally photolithographically defined features, the patterns 177 and 230 may both be pitch multiplied or may have different degrees of pitch multiplication.

Moreover, more than two patterns 177 and 230 can be consolidated in the primary mask layer 140 if desired. In such cases, additional mask layers may be deposited between the layers 130 and 140. For example, the patterns 177 and 230 may be transferred to a mask layer, e.g., the layer 130 or an additional mask layer overlying the primary hard mask layer 140 and then the sequence of steps illustrated in FIGS. 8-13 may be performed to form a new pattern in a photodefinable layer, and to transfer the patterns to the substrate 110.

Figure 15:
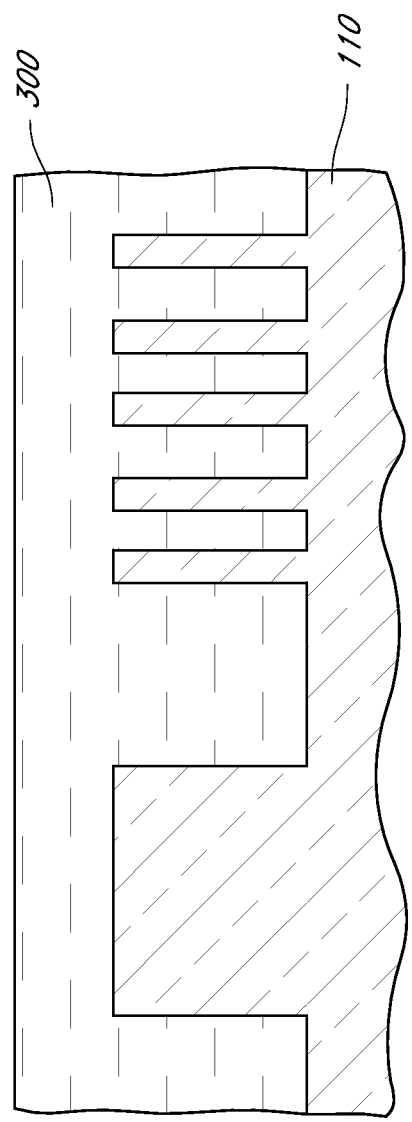
FIG. 15 is a schematic, cross-sectional side view of the partially formed integrated circuit of FIG. 14 after depositing a photoresist layer, in accordance with embodiments of the invention

With reference to FIG. 15, additional patterns can be overlaid pitch multiplied features that have been formed in the substrate 110. For example, after removing overlying mask layers, a negative photoresist layer 300 can be deposited over and between the pitch-multiplied features 310 formed in the substrate 110.

Figure 16:
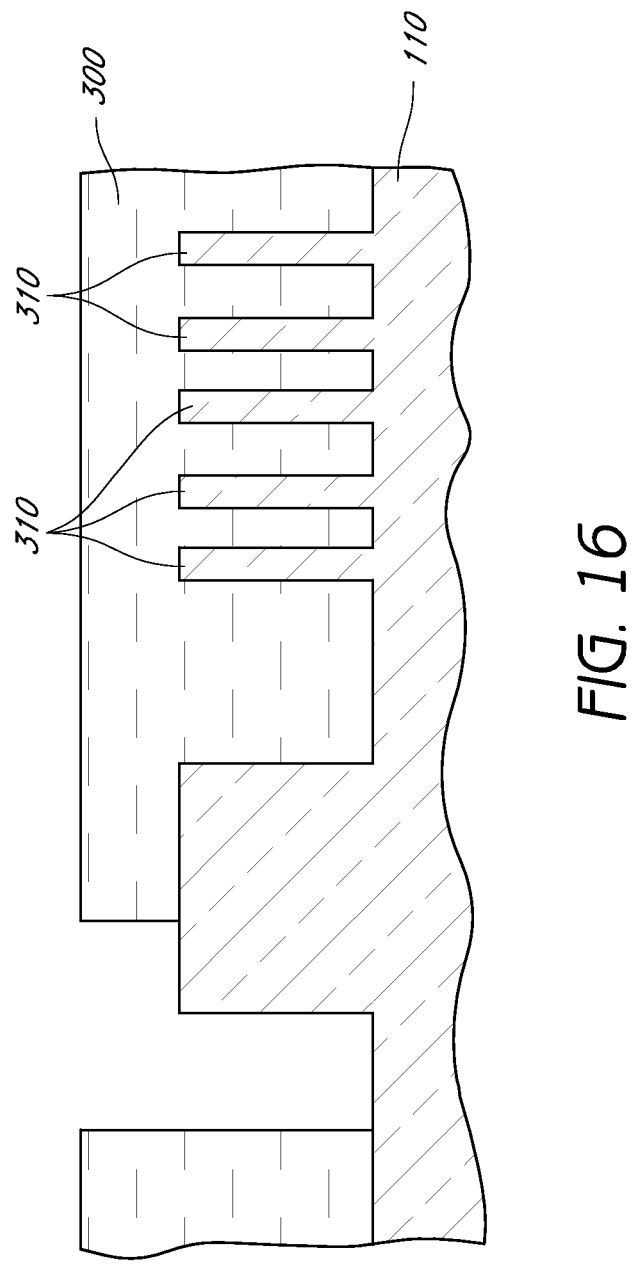
FIG. 16 is a schematic, cross-sectional side view of the partially formed integrated circuit of FIG. 15 after patterning the photoresist layer, in accordance with embodiments of the invention.

With reference to FIG. 16, the negative photoresist layer 300 can be patterned. The substrate 110 can be processed through the patterned layer 300. For example, the substrate 110 can be implanted with ions while the remaining parts of the layer 300 shields selected portions of the substrate 110 from the ion implantation.

In addition, embodiments of the invention may be employed multiple times throughout an integrated circuit fabrication process to form pitch multiplied features in a plurality of layers or vertical levels, which may be vertically contiguous or non-contiguous and vertically separated. In such cases, each of the individual levels to be patterned constitute a substrate 110 and the various layers 120-140 may be formed over the individual level to be patterned. It will also be appreciated that the particular composition and height of the various layers 120-140 discussed above may be varied depending upon a particular application. For example, the thickness of the layer 140 may be varied depending upon the identity of the substrate 110, e.g., the chemical composition of the substrate, whether the substrate comprises single or multiple layers of material, the depth of features to be formed, etc., and the available etch chemistries. In some cases, one or more layers of the layer 120-140 may be omitted or more layers may be added. For example, the layer 140 may be omitted in cases where the hard mask layer 130 is sufficient to adequately transfer a pattern to the substrate 110.

Also, while "processing" through the various mask layers may involve etching an underlying layer in some embodiments, processing through the mask layers may involve subjecting layers underlying the mask layers to any semiconductor fabrication process. For example, processing may involve ion implantation, diffusion doping, depositing, or wet etching, etc. through the mask layers and onto underlying layers.

In addition, the mask layers may be used as a stop or barrier for chemical mechanical polishing (CMP) or CMP may be performed on any of the layers to allow for both planarization and etching of the underlying layers, as discussed in U.S. Patent Application Publication No. 2006-0216923, published Sep. 28, 2006, the entire disclosure of which is incorporated by reference herein.

In addition to partially fabricated integrated circuits, embodiments of the invention may be utilized to pattern other substrates. For example, embodiments of the invention may be applied to form gratings, disk drives, storage media or templates or masks for other lithography techniques, including X-ray or imprint lithography.

Consequently, it will be appreciated from the description herein that the invention includes various embodiments. For example, according to some embodiments of the invention, a method for patterning a substrate is provided. The method comprises providing a photoresist layer over an amorphous carbon layer. The photoresist layer is patterned to form photoresist features. A layer of spacer material is blanket deposited over the photoresist features. The spacer material is preferentially etched from horizontal surfaces to define spacers on sidewalls of the photoresist features. The photoresist features are preferentially removed relative to the spacers. A pattern defined by the spacers is transferred to the amorphous carbon layer to define amorphous carbon mask features. Negative photoresist is deposited over and around the amorphous carbon mask features. The negative photoresist is patterned to form a mask pattern defined by the amorphous carbon mask features and the negative resist. The mask pattern is transferred to a substrate.

According to other embodiments the invention, a method for semiconductor fabrication is provided. The method comprises providing features spaced apart by about 50 nm or less, or about 30 nm or less. Negative photoresist is deposited between and above the features. The negative photoresist is patterned using a photolithographic technique to selectively remove at least some of the negative photoresist from between at least some sections of the features. The features have a feature pitch below a minimum pitch of the photolithographic technique.

According to yet other embodiments of the invention, a method for forming a mask for patterning a substrate is provided. The method comprises patterning a photoresist layer to define photoresist mask features. Other mask features are derived from the photoresist mask features without performing photolithography. The other mask features have a pitch less than about half a pitch of the photoresist mask features. Negative photoresist is deposited over and above the other mask features. The negative photoresist is patterned to expose at least some portions of the other mask features. A pattern defined by the other mask features and the patterned negative photoresist is transferred to an underlying substrate.

In addition to the above disclosure, it will also be appreciated by those skilled in the art that various omissions, additions and modifications may be made to the methods and structures described above without departing from the scope of the invention. All such modifications and changes are intended to fall within the scope of the invention, as defined by the appended claims.

I claim:

1. A method for patterning a substrate, comprising:
providing an amorphous carbon layer over the substrate, and a photoresist layer over the amorphous carbon layer;
patterning the photoresist layer to form photoresist features;

blanket depositing a layer of spacer material over the photoresist features;
preferentially etching the spacer material from horizontal surfaces to define spacers on sidewalls of the photoresist features;
preferentially removing the photoresist features relative to the spacers;
transferring a pattern defined by the spacers to the amorphous carbon layer to define amorphous carbon mask features;
depositing negative photoresist over and between the amorphous carbon mask features;
patterning the negative photoresist to form a mask pattern defined by the amorphous carbon mask features and the negative resist; and
transferring the mask pattern to the substrate.

2. The method of claim 1, further comprising trimming the photoresist features before said blanket depositing the layer of spacer material over the photoresist features.

3. The method of claim 2, wherein said trimming the photoresist features before said blanket depositing the layer of spacer material over the photoresist features, comprises:
exposing the photoresist features to an isotropic etch.

4. The method of claim 1, further comprising removing the spacers before said depositing the negative photoresist.

5. The method of claim 1, wherein said blanket depositing the layer of spacer material over the photoresist features, comprises:
performing an atomic layer deposition to form the layer of spacer material.

6. The method of claim 1, wherein the spacer material is silicon oxide.

7. The method of claim 1, further comprising said transferring the pattern defined by the spacers to a hardmask layer before said transferring the pattern defined by the spacers to the amorphous carbon layer.

8. The method of claim 7, wherein said providing the photoresist layer over the amorphous carbon layer comprises said providing the photoresist layer directly on the hardmask layer.

9. The method of claim 7, wherein the hardmask layer comprises an antireflective coating.

10. The method of claim 1, wherein the amorphous carbon is transparent carbon.

11. The method of claim 1, wherein said transferring the mask pattern to the substrate defines interconnect lines.

12. The method of claim 1, wherein said transferring the mask pattern to the substrate defines control gates of a memory device.

13. The method of claim 1, wherein the spacers extend in spaced, generally parallel relation to one another for at least a part of a length of the spacers.

14. The method of claim 1, wherein said patterning the negative photoresist to form the mask pattern defined by the amorphous carbon mask features and the negative resist, comprises:
forming non-pitch multiplied features.

15. The method of claim 14, wherein said patterning the negative photoresist to form the mask pattern defined by the amorphous carbon mask features and the negative resist, comprises:
forming the non-pitch multiplied features in a periphery region of a partially-fabricated integrated circuit.

16. The method of claim 15, wherein said patterning the negative photoresist to form the mask pattern defined by the amorphous carbon mask features and the negative resist, comprises:
exposing the amorphous carbon mask features in an array region of the partially-fabricated integrated circuit.

* * * * *